(12) United States Patent
Dames

(10) Patent No.: US 9,689,361 B2
(45) Date of Patent: Jun. 27, 2017

(54) METHOD OF OPERATING A FUEL INJECTOR, A CONTROL UNIT THAT PERFORMS THE METHOD, AND A SYSTEM THAT INCLUDES THE CONTROL UNIT

(75) Inventor: Andrew Dames, Cambridge (GB)

(73) Assignee: SENTEC LTD. (GB)

( * ) Notice: Subject to any disclaimer, the term of this patent is extended or adjusted under 35 U.S.C. 154(b) by 170 days.

(21) Appl. No.: 14/125,423

(22) PCT Filed: Jun. 14, 2012

(86) PCT No.: PCT/GB2012/051361
§ 371 (c)(1),
(2), (4) Date: Dec. 11, 2013

(87) PCT Pub. No.: WO2012/172351
PCT Pub. Date: Dec. 20, 2012

(65) Prior Publication Data
US 2014/0110508 A1    Apr. 24, 2014

(30) Foreign Application Priority Data

Jun. 14, 2011 (GB) .................................. 1109975.1
Nov. 30, 2011 (GB) .................................. 1120638.0
Apr. 26, 2012 (GB) .................................. 1207289.8

(51) Int. Cl.
*F02M 51/06* (2006.01)
*H02K 15/00* (2006.01)
(Continued)

(52) U.S. Cl.
CPC .... *F02M 51/0625* (2013.01); *F02M 51/0621* (2013.01); *F02M 51/0689* (2013.01);
(Continued)

(58) Field of Classification Search
CPC ...... H01F 7/122; H01F 7/1646; H01F 7/1877; H01F 2007/1669; H01F 2007/1692;
(Continued)

(56) References Cited

U.S. PATENT DOCUMENTS

| 4,774,485 A | 9/1988 | Dietrich |
| 4,779,582 A | 10/1988 | Lequesne |

(Continued)

FOREIGN PATENT DOCUMENTS

| DE | 3516917 A1 | 11/1986 |
| DE | 3814765 A1 | 11/1989 |

(Continued)

OTHER PUBLICATIONS

International Search Report for International Application No. PCT/GB2012/051361, Mar. 12, 2013, 6 pages.
(Continued)

*Primary Examiner* — Thienvu Tran
*Assistant Examiner* — Kevin J Comber
(74) *Attorney, Agent, or Firm* — Ware, Fressola, Maguire & Barber LLP

(57) ABSTRACT

A solenoid actuator is described. The solenoid actuator comprises an armature, pole piece(s), electromagnet coil(s) arranged, in response to energization, to cause travel of the armature between first and second positions along a direction of travel, permanent magnet(s) positioned and orientated for latching the armature in at least the first position when the armature is in the first position and spring(s) arranged to bias the armature. The solenoid actuator can be operated to provide partial lift.

29 Claims, 24 Drawing Sheets

(51) Int. Cl.
  *H02K 41/02* (2006.01)
  *H02P 25/06* (2016.01)
  *H01F 7/16* (2006.01)
  *F02M 63/00* (2006.01)
  *F16K 31/08* (2006.01)
  *H01F 7/122* (2006.01)
  *H01F 7/18* (2006.01)
  *F02D 41/20* (2006.01)

(52) U.S. Cl.
  CPC .... *F02M 51/0692* (2013.01); *F02M 63/0024* (2013.01); *F16K 31/082* (2013.01); *H01F 7/122* (2013.01); *H01F 7/1646* (2013.01); *H02K 15/00* (2013.01); *H02K 41/02* (2013.01); *H02P 25/06* (2013.01); *F02D 41/20* (2013.01); *F02D 2041/2027* (2013.01); *F02D 2041/2058* (2013.01); *F02D 2041/2072* (2013.01); *F02D 2041/2082* (2013.01); *H01F 7/1877* (2013.01); *H01F 2007/1669* (2013.01); *H01F 2007/1692* (2013.01); *H01F 2007/1888* (2013.01); *Y10T 29/49009* (2015.01)

(58) Field of Classification Search
  CPC ........ H01F 2007/1888; F02M 51/0621; F02M 51/0625; F02M 51/0689; F02M 51/0692; F02M 63/0024; H02K 15/00; H02K 41/02; H02P 25/06; F16K 31/082; F02D 41/20; F02D 2041/2027; F02D 2041/2085; F02D 2041/2072; F02D 2041/2082; Y10T 29/49009
  USPC ........................................................ 361/152
  See application file for complete search history.

(56) References Cited

U.S. PATENT DOCUMENTS

| | | | |
|---|---|---|---|
| 4,829,947 A | 5/1989 | Lequesne | |
| 5,029,807 A | 7/1991 | Fuchs | |
| 5,127,585 A | 7/1992 | Mesenich | |
| 5,521,446 A * | 5/1996 | Chalupa | H02K 41/0352 310/12.01 |
| 6,845,001 B1 * | 1/2005 | Kinbara | H01F 7/1844 361/152 |
| 8,166,953 B2 | 5/2012 | Caley | |
| 2003/0062030 A1 * | 4/2003 | Oashi | F02D 41/08 123/496 |
| 2003/0169552 A1 * | 9/2003 | Seale | F01L 9/04 361/160 |
| 2004/0134468 A1 * | 7/2004 | Yamazaki | F02D 41/20 123/499 |
| 2008/0198529 A1 * | 8/2008 | Rembold | F02D 41/20 361/195 |
| 2012/0261499 A1 | 10/2012 | Dames | |

FOREIGN PATENT DOCUMENTS

| | | |
|---|---|---|
| DE | 10 2005 030 453 | 1/2006 |
| DE | 10 2008 054877 A1 | 7/2010 |
| DE | 10 2009 026930 A1 | 12/2010 |
| EP | 2194543 A1 | 6/2010 |
| EP | 1 982 069 B1 | 5/2012 |
| GB | 2175452 A | 11/1986 |
| GB | 2208041 | 2/1989 |
| GB | 2213650 | 8/1989 |
| GB | 2466102 | 6/2010 |
| JP | 56-081232 A | 7/1981 |
| JP | 11-148439 A | 6/1999 |
| JP | 2000-277328 A | 6/2000 |
| JP | 2001-3791 A | 1/2001 |
| JP | 2003-7531 | 1/2003 |
| WO | 2007/090228 A1 | 8/2007 |
| WO | 2011/058344 | 5/2011 |
| WO | 2011058344 A1 | 5/2011 |

OTHER PUBLICATIONS

GB Search Report for Application No. GB1020528.4, dated Jan. 7, 2011, 2 pages.
International Search Report for International Application No. PCT/GB2010/051849, Apr. 20, 2011, 4 pages.
Written Opinion of the International Searching Authority (EP), (PCT/GB2012/051361), Mar. 12, 2013, 10 pages.
English Abstract for JP2003007531, published Jan. 10, 2003, Espacenet, 2 pages.
European Search Report (counterpart EPA serial No. 14 155 084.8), dated Mar. 27, 2014, 11 pages.
International Preliminary Report on Patentability (Form PCT/IB/373 (1 page) plus Form/ISA/237 (9 pages)) for International Application No. PCT/GB2012/051361, date of issuance of report Dec. 17, 2013, 10 pages total.
Extended European Search Report, application No. 14155084.8, search report dated Jul. 21, 2016, 11 pages.
Japanese Office Action citing four foreign patent documents listed above, corresponding application 2014-515288 filed Dec. 13, 2013, office action dated Oct. 17-19, 2016, 3 pages.
Machine translation of JP 2001-003791, 13 pages.
Machine translation of JP 2000-277328, 19 pages.
Machine translation of JP 11-148439, 21 pages.
Machine translation of JP 56-081232, 5 pages.

* cited by examiner

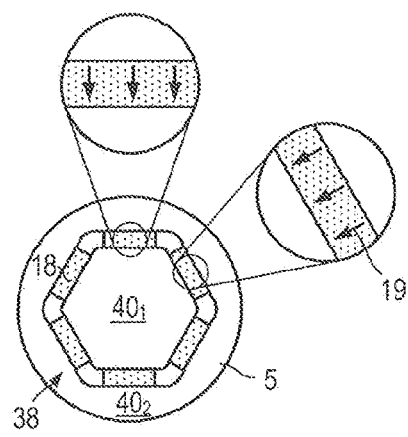 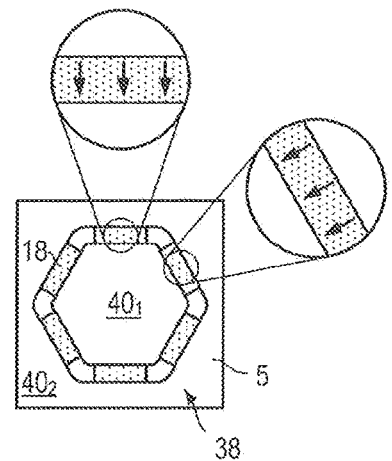
Fig. 8a  Fig. 8b
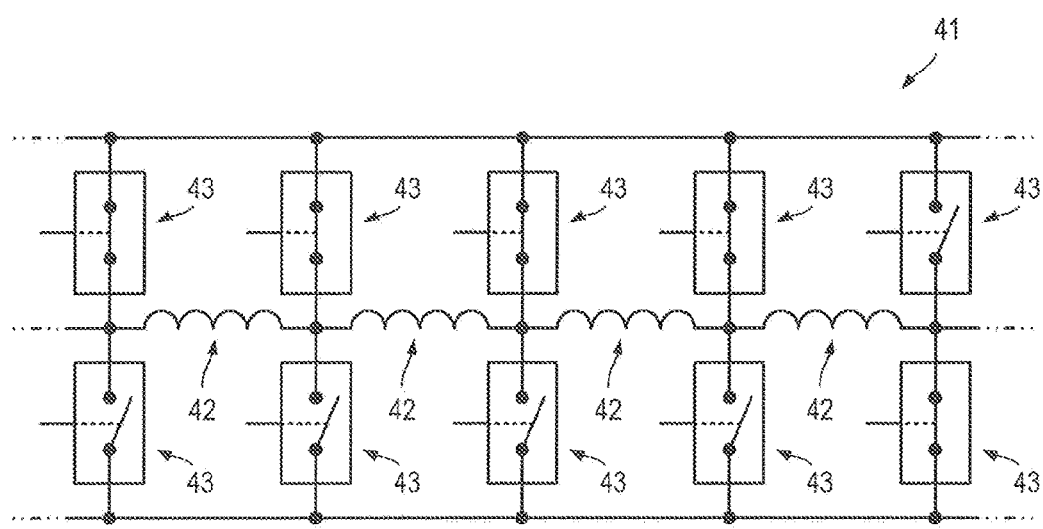
Fig. 9

METHOD OF OPERATING A FUEL INJECTOR, A CONTROL UNIT THAT PERFORMS THE METHOD, AND A SYSTEM THAT INCLUDES THE CONTROL UNIT

FIELD OF THE INVENTION

The present invention relates to a solenoid actuator.

BACKGROUND

WO 2011/058344 A1 describes a solenoid actuator. The solenoid actuator includes a permanent magnet which provides a bias which can allow fewer amp turns to be used. Thus, a smaller coil cross section and a shorter magnetic path length may be used which can help to reduce magnetic leakage which in turn can mean that even fewer amp turns can be used.

Although the solenoid actuator described in WO 2011/058344 A1 ibid. has advantages over solenoid actuators without a permanent magnet, such as the potential to provide greater opening force, further improvements can be made.

SUMMARY

According to a first aspect of the present invention there is provided a solenoid actuator. The solenoid actuator comprise an armature, pole piece(s), electromagnet coil(s) arranged, in response to energisation, to cause travel of the armature between first and second positions along a direction of travel, permanent magnet(s) positioned and orientated for latching the armature in at least the first position and spring(s) arranged to bias the armature.

The actuator may be configured such that the armature is stably positionable at more than one position, for example at any position, between the first and second positions dependent upon current(s) through the electromagnet coil(s). Thus, variable lift can be achieved without the need for a position sensor. Open-loop control variable lift may be achieved which depends on current.

The spring(s) may comprise a cylindrical flexure having a lumen. The pole piece(s), the armature and the electromagnet coil(s) may be disposed within the lumen.

The spring(s) may comprise at least one plate-based flexure comprising a plate flexure or a stack of at least two plate flexures arranged such that the or each plate flexure is (are) disposed along the direction of travel and normal(s) of the or each respective plate flexure is (are) orientated substantially parallel to the direction of travel. This can help to reduce the width or diameter of a solenoid actuator. The or each plate may include one or more slits and/or one or more apertures. The or each plate may be disc shaped. The at least one plate-based flexure may comprise first and second plate-based flexures. The pole piece(s), armature and electromagnet coil(s) may be disposed between first and second plate-based flexures.

The at least one permanent magnet may comprise at least 5 permanent magnets arranged on sides of a regular polygon such that magnetisations of the permanent magnets point inwardly or outwardly. This can help to provide a uniform radial magnetic field.

At least one of the permanent magnet(s) may be fixed with respect to the pole piece(s). Mechanically decoupling the permanent magnet(s) from the armature can help to reduce the mass of the armature structure and, thus, allow the armature to accelerate faster for a given force. At least one of the permanent magnet(s) may pass through the armature. At least one of the electromagnet coil(s) may be fixed with respect to the pole piece(s).

The actuator may comprise at least two pairs of electromagnet coils and at least two pairs of permanent magnets disposed in the armature. Each pair of electromagnet coils may be associated with a corresponding pairs of permanent magnets so as to drive the armature in parallel. This can help to increase the force applied by the actuator.

The actuator may comprise at least two linked armatures arranged in a stack along the direction of travel. Each armature may support at least one respective magnet and the solenoid actuator comprises at least two pairs of electromagnet coils. This can help to increase the force for given cross-sectional area of actuator.

Each armature may comprise first and second opposite shaped faces. The mass of the armature can be reduced by shaping the faces of the armature, for example by beveling. This can help increase acceleration for a given force. The armature may include conical or pyramidal portions. The armature may include frusto-conical or frusto-pyramidal portions. The first and second faces may be generally convex. The pole piece(s) may include at least one correspondingly inversely-shaped face for seating the armature. This can help to minimise the gap between the armature and the poles piece.

The actuator or sets of actuators may comprise a single coil arranged in a single annulus.

The permanent magnet(s) may predominately comprise samarium-cobalt or neodymium.

The spring(s) may be configured to provide sufficient force so as to prevent the armature from latching in second position. The spring(s) may be configured to provide a force in the same direction over the length of travel of the armature. The spring(s) may be configured to provide a substantially constant force over the length of travel of the armature. The spring(s) may be configured to provide a force which varies over the length of travel of the armature. The force may vary by a factor of less than 2:1. If there are two or more springs, then the force may be the net force of the springs. The magnitude of the spring constant of the spring(s) may be less than the magnitude of the spring rate of a magnetic spring provided by the solenoid actuator. The magnitude of the spring constant of the spring(s) may be greater than the magnitude of the spring rate of a magnetic spring provided by the solenoid actuator. The magnitude of the spring constant of the spring(s) may have a value in a range between 1.5 and 2.0 the magnitude of the spring rate of a magnetic spring provided by the solenoid actuator without the at least one spring. If there are two or more springs, then the spring constant may be the net spring constant of the springs.

The actuator may further comprise a tube. The at least one electromagnet coil may comprise a single coil. The single coil may be disposed without the tube and the actuator is disposed within the tube. Thus, the actuator can be used as a wet actuator. The at least one permanent magnet may be disposed without the tube. The tube may comprise a material having an initial relative permeability of at least 25. The tube may comprise a material having a saturation flux density less than 2 T. The tube may comprise a material having an initial relative permeability of between 1 and 2. The material may be an austenitic stainless steel, such as Type 304, Type 310, Type 316 or Type 321. The material be a nitrogen-strengthened austenitic stainless steel, such as Nitronic 33 of Nitronic 50. The material may be a martensitic stainless steel, such as Type 17-4 or Carpenter 465 type. The material may be a duplex stainless steel, such as Sanvik SAF 2205.

The tube may have stepped walls. The tube may comprise at least two sections in the vicinity of the actuator which have first and second different diameters. The tube may comprise first, second and third portions in the vicinity of the actuator. The second tube portion may be disposed between the first and third portions of the tube and have a greater diameter than the first and third portions thereby forming a pipe bulge which accommodates parts of the actuator. Using a stepped-wall pipe can allow multiple parts, such as pole pieces and the armature, to be easily assembled, for example, by dropping parts into the pipe. The parts rest on one or more seats formed between sections of pipe having different diameters.

The tube may have a plurality of sections having different magnetic properties.

The tube may comprise at least first, second, third, fourth and fifth sections. The second section may be interposed between first and third sections and the fourth section may be interposed between third and fifth sections. The second and fourth sections may have relatively low values of relative permeability and the first, third and fifth sections have relatively high values of relative permeability. Thus, the properties of the tube can be adapted to minimise flux leakage. Sections of the tube having different values of relative permeability may be formed from different material. For example, the first, third and fifth sections may comprise high permeability steel tubes and the second and fourth sections may comprise low permeability steel tubes or welds. Sections of the tube having different values of relative permeability may be formed by annealing different sections of the tube under different conditions.

The at least one spring may comprise a fixed spring having fixed stiffness.

The fixed spring may be chosen from one of a plurality of fixed springs having different spring rates. Thus, at assembly, an actuator can be calibrated and a fixed spring of appropriate spring rate can be chosen and used.

According to a second aspect of the present invention there is provided a set of actuators. Each actuator comprises substantially identical pole pieces, armatures, electromagnet coils and permanent magnets and wherein at least one actuator in the set comprises a fixed spring having a different spring rate to another actuator in the set. Thus, the use of calibration springs can be identified by inspecting a set of actuators.

The at least one adjustable spring can be used, for example, to apply a closing force. This can be use in an injector to apply the closing force to a needle or pintle.

The fixed spring may be preloaded.

The at least one spring may comprise a single spring having first and second points or regions of attachment and a third, further point or region of attachment. The armature may be attached to the third point or region of attachment of the spring. Thus, the single spring may be considered to behave as two springs.

The at least one spring may comprise at least two separate springs including first and second springs. The armature may be attached to the first and second springs. The armature and the first and second springs may be arranged such that movement of the armature causes extension or deflection of the first spring and compression or opposite deflection of the second spring.

The springs may be initially under compression and stay under compression between the first and second positions. This can help facilitate formation of the actuator since the springs do not need to be anchored to other parts of the actuator.

The at least one spring may include a fluid. For example, the actuator may be included in a fuel injector and spring force may be provided, at least in part, by a liquid or gaseous fuel.

The spring(s) may be helical springs.

All or part of the at least one pole piece and/or armature may predominantly comprise ferrous cobalt or ferrous cobalt chromium. All or part of the at least one pole piece may predominantly comprise Somaloy®. For example, in a wet-type actuator, parts of the pole piece which do not move and/or which do not come into contact with the working fluid may be formed from Somaloy®.

The spring(s) may be configured to help latch the armature in the first position.

The spring(s) may be configured to prevent the armature from latching in second position.

The actuator may be a short-travel actuator as defined in WO 2011/058344 A1 ibid. The actuator may be a non-short-travel actuator.

The actuator may have a length of travel up to 800 µm. The actuator may have a length of travel up to 1 mm or up to 2 mm.

A ratio of external width or diameter (d) of the actuator and the travel of actuator ($\Delta t$) may be less than 100. The ratio of external width or diameter of the actuator and the travel of actuator may be at least 20.

The at least one spring may have a (net) spring constant, $k(N/\mu m)$, in a range of 5 $Ncm^{-2} \times A/t$ and 20 $Ncm^{-2} \times A/t$, where A is the active area of a pole piece in $cm^2$ and t is the gap length in µm between the armature and a pole piece.

The spring(s) may comprise at least first and second springs, wherein the first spring is configured to damp the armature when returning to the first position.

The actuator may further comprise an actuated member and the armature may be configured to drive the actuated member.

The actuated member may comprise first and second parts. The armature may be fixedly coupled to the first part of the actuated member such that the armature and first part of the actuated member move together. The first part of the actuated member may be slidably coupled to the second part of the actuated member such that the first and second parts of the actuated member move together in a first direction and to move independently in a second, reverse direction.

The actuator may comprise a spring configured to bias the second part of the actuated member.

The actuated member may comprise a pintle or needle.

According to a third aspect of the present invention there is provided apparatus comprising the actuator and a controlling means (e.g. a control unit) operatively connected to the actuator.

The controlling means may be configured to apply a first pulse of current (or "first drive waveform portion") in a first direction (or "polarity") through the electromagnet coil(s) so as to energise the electromagnet coil(s). The first pulse may have a duration which is greater than a duration of travel of the armature.

The controlling means may be configured to apply a second pulse of current (or "second drive waveform portion") in a second, reverse direction (or "opposite polarity") through the electromagnet coil(s). This can be used to help close the actuator.

The controlling means may be configured to apply the second pulse of current when the armature is in the first position. This can be used to generate additional closing force. This may be used in, for example, an inward-opening injector to help counter an opening force generated by combustion.

The controlling means may be configured to be adaptably impedance-matched with the electromagnet coil(s) to reduce bounce when the armature stops travelling. This can be used to reduce bounce without the need for sensing.

The controlling means may be configured to measure back emf(s) from the electromagnet coil(s) and to determine position of the armature.

The controlling means may be configured to determine position of the armature in dependence upon the measured back emf(s).

The controlling means may be configured to control the current(s) applied to the electromagnet coil(s) in dependence upon the measured back emf(s). Thus, the back emf(s) can be used to enhance control of partial lift and/or to help reduce bounce.

The apparatus may further comprise a diagnostic unit configured to analyse the measured back emf(s) and/or to record characteristics of the measured back emf(s).

The apparatus may comprise flux-sensing loop(s) and/or coils(s) to sense flux in the magnetic circuit.

In the case of an actuator which includes two (or more) coils, one of the coils in the actuator may be used for actuating and the other coil in the actuator may be used to detect the rate of change of flux in the magnetic circuit, for example, to assist the controlling means to adjust the drive waveform of the current waveform or following waveform.

The controlling means may be configured to control the current(s) applied to the electromagnet coil(s) in dependence upon the sensed current(s). Thus, the sensed currents can be used to enhance control of partial lift and/or to help reduce bounce.

The controlling means may be configured to provide a drive waveform comprising a rise section, a hold section and a fall section.

According to a fourth aspect of the present invention there is provided apparatus comprising an array of N solenoid actuators. The apparatus further comprises a parallel array of N+1 pairs of switches, wherein each pair of switches are connected in series via a junction and each solenoid actuator is connected between junctions of adjacent pairs of switches such that adjacent solenoid actuators share a respective pair of switches. Thus, the solenoid actuators can be independently controlled using fewer switches.

The switches may comprise field-effect transistors.

According to a fifth aspect of the present invention there is provided a device for controlling fluid flow comprising an actuator.

According to a sixth aspect of the present invention there is provided a fuel injector comprising an actuator.

According to a seventh aspect of the present invention there is provided a method of operating a solenoid actuator. The actuator comprises an armature, pole piece(s), electromagnet coil(s) arranged, in response to energisation, to cause travel of the armature between first and second positions along a direction of travel, permanent magnet(s) positioned and orientated for latching the armature in at least the first position and spring(s) arranged to bias the armature. The method comprises applying turn-on drive waveform(s) to the electromagnet coil(s) having profile(s) and duration so as to position the armature stably at a position between the first and second positions and at which the armature is substantially at rest, and to cause current(s) in the coil(s) to reach predetermined hold value(s).

Thus, the solenoid actuator can be operated to provide partial lift. This may enable open-loop variable lift control of the actuator.

The method may further comprise applying hold drive waveform(s) to the electromagnet coil(s) having profile(s) and duration so as to hold the armature at the position between the first and second positions and to drive current(s) through the coil(s) having said hold current.

The method may further comprise applying turn-off drive waveform(s) to the electromagnet coil(s) having profile(s) and duration so as to cause the armature to move towards the first position.

The or each turn-off drive waveform may include a bias profile portion of opposite polarity to the turn-on drive waveform. The or each turn-off drive waveform includes a bias profile portion of zero applied bias.

The method may further comprise applying an anti-bounce drive waveform(s) to the electromagnet coil(s) so as to decelerate the armature returning to the first position.

The method may further comprise generating drive waveform(s) for a first cycle, obtaining measurements from the first cycle and generating drive waveform(s) for a second, later cycle based on the measurements. Thus, a process of feed forward may be used.

The electromagnet coil(s) may comprise a single coil. The electromagnet coil(s) may comprise two or more electromagnet coils. In the case of two or more coils, the same drive waveform may be applied to at least two of the coils. In the case of two or more coils, a first drive waveform may be applied at least one of the coils and a second drive waveform which is the inverse of the first drive waveform may be applied at least one of the other coils.

According to an eighth aspect of the present invention there is provided a method comprising forming the actuator, the apparatus, the device or fuel injector.

The method may comprise providing each part of the actuator, apparatus, device or fuel injector.

According to a ninth aspect of the present invention there is provided a method of forming an actuator. The method may comprise providing an armature, providing pole piece(s), providing electromagnet coil(s) arranged, in response to energisation, to cause travel of the armature between first and second positions along a direction of travel, providing permanent magnet(s) positioned and orientated for latching the armature in at least the first position and providing spring(s) arranged to bias the armature.

The method may comprise measuring performance of the actuator without the spring(s) or with test spring(s), selecting spring(s) of predetermined spring constant(s) in preference to spring(s) of different spring constant(s) based on the performance of the actuator and adding the spring(s) of predetermined spring constant(s) in the actuator.

The method may comprise partially demagnetising the permanent magnet(s). For example, demagnetising the permanent magnet(s) may comprise heating the magnet(s), driving excess drive current through the coil(s) and/or applying an external magnetic field. This can help to trim the actuator even after assemble.

The method may further comprise adjusting a preload provided by the spring(s).

BRIEF DESCRIPTION OF THE DRAWINGS

FIG. 8a is a plan view of a set of six permanent magnets arranged along sides of a polygon set in a circular armature;

FIG. 8b is a plan view of a set of six permanent magnets arranged along sides of a polygon set in a rectangular armature;

FIG. 9 is a schematic diagram of control circuit for four actuators;

DETAILED DESCRIPTION OF CERTAIN EMBODIMENTS

Figure 1:
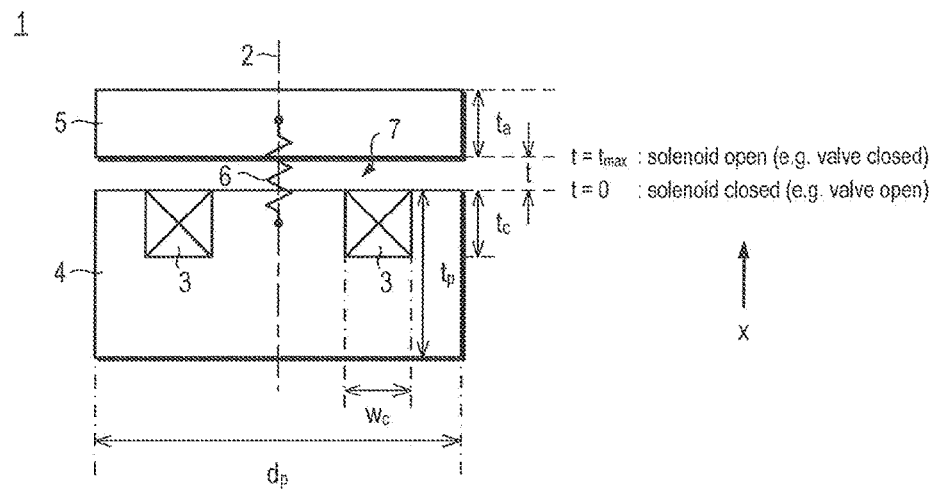
FIG. 1 is a schematic diagram of a single-acting solenoid actuator with a stiff spring.

In the following description of the operation of solenoid actuators, like parts are denoted by like reference numerals.

Solenoid Actuator 1

Referring to FIG. 1, a single-acting solenoid actuator 1 is shown. The actuator 1 has an axis 2 and comprises an electromagnetic coil 3 wound around the axis 2, a pole piece 4 associated with the coil 3, an armature 5 axially spaced apart from the pole piece 4 and a compression spring 6 having a spring constant. Herein, the term "spring constant" may also be referred to "spring rate", "spring coefficient" or "stiffness". An air gap 7 having a gap size, t, is formed between the pole piece 4 and armature 5.

FIG. 1 shows the actuator 1 in a fully open position, i.e. $t=t_{max}$, without the electromagnetic coil 3 energised. The fully open position is the maximum displacement at which the valve is still held closed by the spring. The electromagnetic coil 3 can be used to close the air gap 7, i.e. $t=0$, by energising the coil 3 with current flowing in a suitable direction.

Flux-Switched Solenoid Actuator 11

Figure 2:
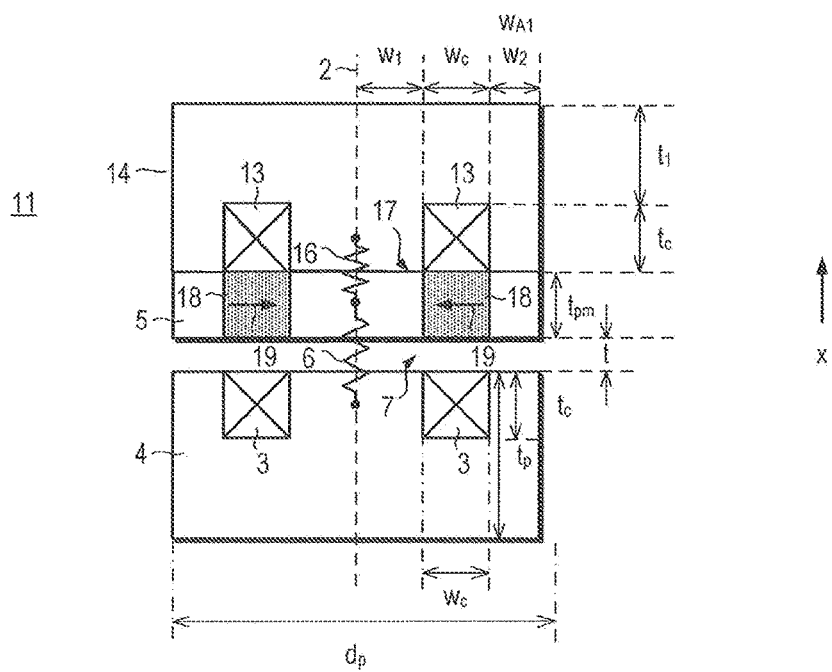
FIG. 2 is a schematic diagram of a solenoid actuator comprising an armature which includes two permanent magnets.

Referring to FIG. 2, a flux-switched solenoid actuator 11 is shown. Similar to the single-acting solenoid actuator 1 shown in FIG. 1, the solenoid actuator 11 has an axis 2 and comprises a first electromagnetic coil 3 wound around the axis 2, a first pole piece 4 associated with the first coil 3, an armature 5 axially spaced apart from the first pole piece 4 and a first compression spring 6 having a spring constant, k. A first air gap 7 having a gap size, t, is formed between the first pole piece 4 and armature 5.

The actuator 11 includes a second electromagnetic coil 13 wound around the axis 2, a second pole piece 14 associated with the second electromagnetic coil 13 and a second compression spring 16 having a spring constant. In this example, the spring constants are the same. A second air gap 17 having a gap size, u, is formed between the second pole piece 14 and the armature 5. In this example, u=$t_{max}$−t. Thus, when t=$t_{max}$, u=0 and when t=0, u=$t_{max}$. The solenoid actuator 11 includes two permanent magnets 18 having inwardly-orientated magnetisations 19.

The solenoid actuator 1 shown in FIG. 1 and the solenoid actuator 11 shown in FIG. 2 behave differently, as will now be described in more detail in the context of a fuel injector valve (not shown). In the following, when the actuator is open (i.e. t=$t_{max}$), the valve is closed. When the actuator is closed (i.e. t=0), the valve is open.

Comparison of Solenoid Actuator 1 and Solenoid Actuator 11

Behaviour of Solenoid Actuator 1

Referring to FIG. 1, in the solenoid actuator 1, the coil 3 produces a magnetomotive force (MMF) of NI where N is the number of turns and I is the current. Magnetomotive force is related to the magnetic flux $\phi$=B·A (where B is the magnetic field and A is the area) through the magnetic circuit by the reluctance, R, namely R=MMF/$\phi$. The magnetic field B in the gap 7 which has gap size, t, varies when t changes since the total reluctance of the magnetic circuit changes.

The total reluctance, $R_{tot}$, of the magnetic circuit is $R_{tot}$=$R_{steel}$+$R_{gap}$ where $R_{steel}$ is the total reluctance of the soft magnetic parts of the circuit 4, 5 (which may be formed from steel or another soft magnetic material) and $R_{gap}$≈(t/A$\mu_0$). The magnetic field in the gap 7 is B≈(NI/A)/$R_{tot}$≈NI/A)/($R_{steel}$+(t/A$\mu_0$)).

The magnetic force, $F_{mag}$, on the armature 5 $F_{mag}$≈−(A/2$\mu_0$)·B$^2$≈−(A $\mu_0$/2)·((NI/A)/($R_{steel}$+(t/A$\mu_0$)))$^2$. The magnetic force, $F_{mag}$, is limited, in the case of saturation, to $F_{mag}$≈−(A/2$\mu_0$)·($B_{sat}$)$^2$. The sign of magnetic force, $F_{mag}$, is negative since the force pulls the armature 5 toward the pole piece 4. This is counteracted by a mechanical spring 6 providing a force to close the valve $F_{sp}$=k($t_0$−t) where to $t_0 \geq t_{max}$ and $t_0$ is typically several times $t_{max}$.

When the coil 3 is not energised, the valve is closed (t=$t_{max}$). To open the valve (i.e. dose the actuator), a current is required which is larger than approximately $\sqrt{(k(t_0-t_{max}))}$·($R_{steel}$+($t_{max}$/A$\mu_0$))·(1/N)$\sqrt{(2A)}$. The valve remains open as long as the current is flowing. If the current drops, the valve will start to close when the current drops below approximately $\sqrt{(kt_0)}$·$R_{steel}$·(1/N)$\sqrt{(2A)}$. This behaviour is therefore hysteretic provided that the change in circuit reluctance exceeds the square root of the change in spring force which is usually the case.

This hysteretic behaviour is exhibited in a plot of gap size, t, against current, I.

Behaviour of Solenoid Actuator 11

Referring to FIGS. 2 and 3a to 3e, behaviour of a solenoid actuator with and without current will now be described.

—Magnetic Behaviour with No Current and No Spring—

First, behaviour of the solenoid actuator 11 under the influence of the permanent magnets 18, without the influence of the coils or mechanical springs, is considered:

The flux out of the permanent magnets 18 into the armature 5 $\phi_m$=$B_{pm}$·$A_{pm}$, where $B_{pm}$ is the field from the permanent magnets 18 and $A_{pm}$ is the area though which flux passes from the permanent magnets 18. The total flux from the magnets 18 remains constant and the flux scales similarly to the field since the area does not change in this application and the thickness of the permanent magnets 18 is typically greater than the actuator travel. Thus, the total reluctance seen by the permanent magnets 18 does not increase significantly between the armature being located in the centre of the gap to be being located at either end.

Flux passes through two gaps 7, 17 which lie above and below the armature 5 respectively. The flux (and therefore field) is shared between the two gaps 7, 17 in proportion to their gap size. The gap size of the lower gap 7 is t (where t=$t_{max}$ corresponds to the upper gap 17 having zero width and the lower gap 7 having width $t_{max}$).

In the following, $B_{pm}$ is adjusted by the ratio $A_{pm}$/$A_{pole}$ (where $A_{pole}$ is the area though which flux passes from the poles) to account for different areas. The magnetic fields $B_1$, $B_2$ in the upper and lower gaps 7, 17 respectively are:

$$B_1=(t/t_{max})B_{pm}=yB_{pm} \qquad (1\text{-}1)$$

$$B_2=(t/t_{max}-1)B_{pm}=(y-1)B_{pm} \qquad (1\text{-}2)$$

where y is displacement. The signs reflect the direction of the field relative to x in FIG. 2.

The reluctance, $R_{pm}$, of the permanent magnet flux circuit path is given by:

$$R_{pm}\approx(t_{pm}/A_{pm}\mu_0)+(y(y-1))\cdot(t_{max}/A_{pole}\mu_0)+R_{steel} \qquad (2)$$

$A_{pm}$ is typically similar to $A_{pole}$ resulting in a maximum value of $B_1$ or $B_2$ which is approximately equal to $B_{pm}$. $R_{pm}$ is typically dominated by $t_{pm}$ and this is largely made up of the thickness of the magnet. Thus, $B_{pm}$ is a large fraction (for example, 0.5 to 0.8) of the remanence $B_r$ of the magnet material. (y(y−1)) varies from zero at the extremes of travel to a maximum of ¼ in the centre.

The energy density in a field is ½B·H or, in free space, ½B$^2$/$\mu_0$. The energy stored in a volume of width t between pole pieces of area A is E=½B$^2$At/$\mu_0$. Changing the volume by altering the (lower) gap size, t, results in a force of approximately F=½B$^2$A/$\mu_0$. For clarity and convenience, the factor 1/(2$\mu_0$) will be ignored in the following description.

The forces on the armature due to each field (ignoring the factor ½$\mu_0$) are as follows:

$$F_1=AB_1^2=Ay^2B_{pm}^2 \qquad (3\text{A-}1)$$

$$F_2=-AB_2^2=-A(1+y^2-2y)B_{pm}^2 \qquad (3\text{A-}2)$$

Summing these forces gives the total force, F, on the armature:

$$F=F_1+F_2=A(2(y-\tfrac{1}{2})B_{pm}^2) \text{ at } I=0 \qquad (3\text{A-}3)$$

This shows that the force, F, varies linearly with displacement, y, and is zero at the centre where y=½.

For the following description, $B_{pm}$ is chosen such that the soft magnetic material has saturated when the armature 5 touches the pole piece 4, 14. Therefore, the force at either end of travel is $F_{max}$=±$AB_{pm}^2$. The maximum force limited by saturation is $F_{max}$=$AB_{sat}^2$.

—Magnetic Behaviour with Current but No Spring—

Next, behaviour of the solenoid actuator under the influence of the permanent magnets 18 and the coils 3, 13 is considered:

Passing current through the upper and lower coils 13, 3 in the same direction results in an additional field $B_c$≈NI $\mu_0/t_{max}$ in both gaps. Note that, unlike the flux from the magnet, the additional field is in the same direction in both gaps. This is added to the fields $B_1$ and $B_2$ from the permanent magnets before the total field is squared to calculate the force (again ignoring the factor ½$\mu_0$:

$$F_1=A(B_1+B_c)^2=(yB_{pm}+B_c)^2 \qquad (3\text{B-}1)$$

$$F_2=-A(B_2+B_c)^2=-((y-1)B_{pm}+B_c)^2 \qquad (3\text{B-}2)$$

The forces are summed as before to give the total force:

$$F=A(2(y-\tfrac{1}{2})B_{pm}^2+2(y-\tfrac{1}{2})B_{pm}B_c(I)) \qquad (3\text{B-}3)$$

Figure 3A:
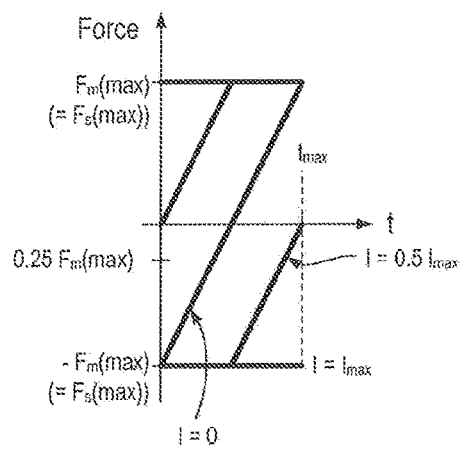
FIG. 3a shows a set of force characteristics for a magnetic spring of the actuator shown in FIG. 2.
Figure 3B:
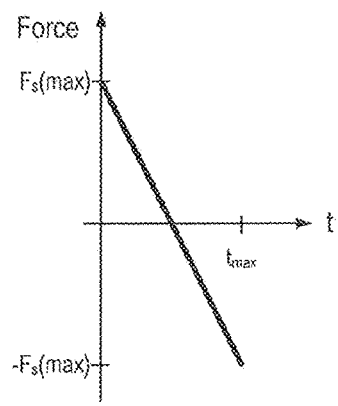
FIG. 3b shows a force characteristic for a mechanical spring of the actuator shown in FIG. 2.
Figure 3C:
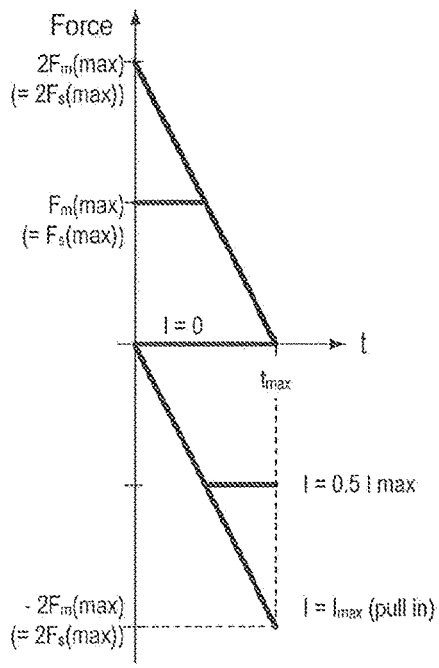
FIG. 3c shows a set of force characteristics for a combination of the magnetic spring and mechanical spring shown in FIG. 2.
Figure 3D:
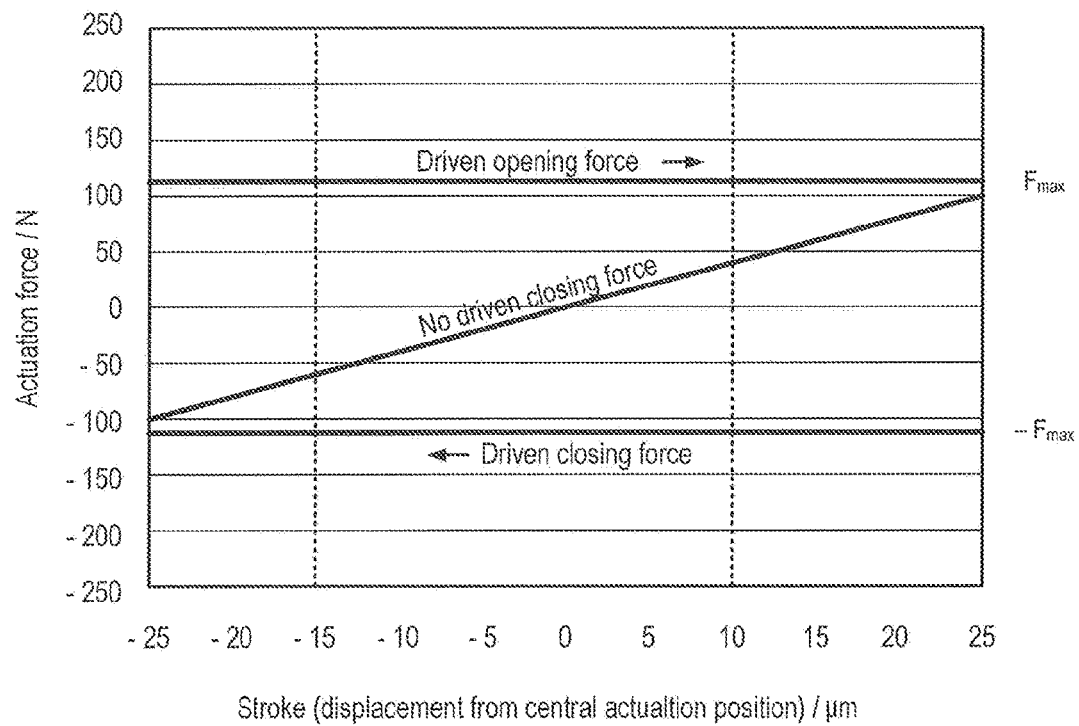
FIG. 3d shows plots of force against stroke for the solenoid actuator shown in FIG. 2 without a mechanical spring.

Thus, force is linear in armature position, plus a linear force dependent on current. However, the force in each opposite gap can be no higher than $F_{max}$ due to saturation effects. So, with a non-zero current, when the force in a gap reaches $F_{max}$ at some value oft, it will go no higher. If the drive current $I_{max}$ (variable with actuator position) is set such that the total field in either the top gap or the bottom gap is equal to $B_{sat}$ or $B_{pm}$, and the field in the opposite gap will be close to zero, $F=\pm F_{max}$ for all armature positions t. This behaviour is shown in FIGS. 3a and 3d, and, when combined with a, spring in FIGS. 3c and 3e.

—Magnetic Behaviour with Current and with a Spring—

Finally, behaviour of the solenoid actuator 11 under the influence of the permanent magnets 18, the coils 3, 13 and a spring 6, 16 is considered:

The magnetic force can only pull the armature towards one of the pole pieces 4, 14. A spring 6, 16 can be added which is capable of pushing the armature 5 away from a pole piece 4, 14. The stiffness of the spring can be chosen to match the magnetic spring. The spring behaviour is shown in FIG. 3b and the combined behaviour of the magnetic and mechanical springs is shown in FIG. 3c.

Figure 3E:
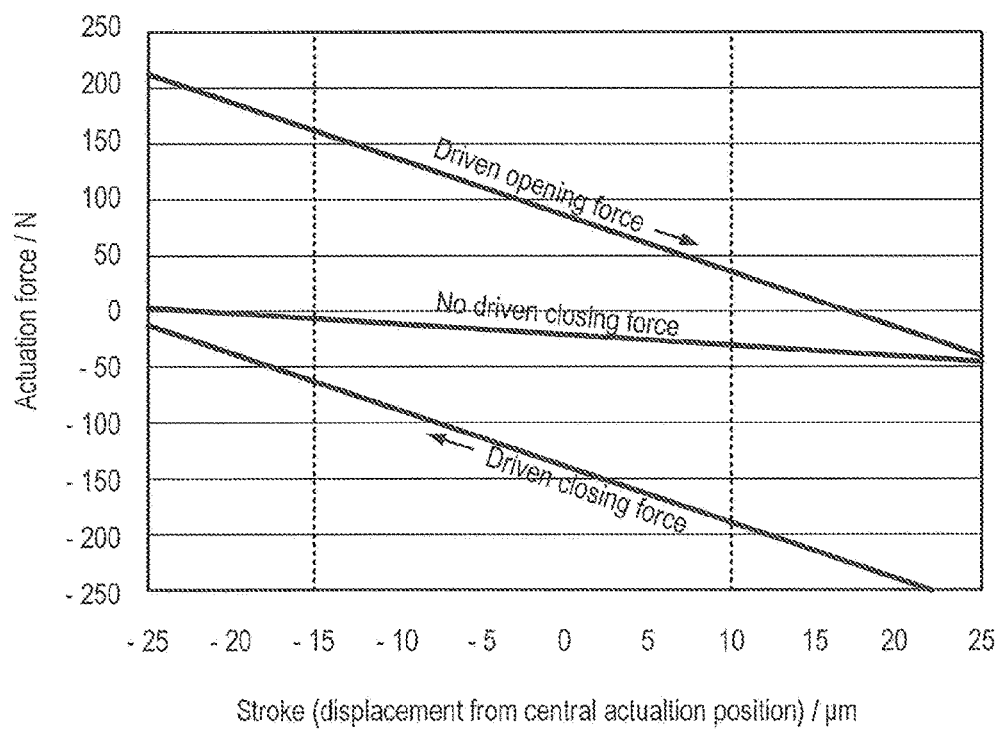
FIG. 3e shows plots of force against stroke for the solenoid actuator shown in FIG. 2 with a mechanical spring.

Since the spring force and the magnetic force combine, a force of up to $2F_{max}$ is available to urge the actuator open (or shut) by setting the current at $I_{max}$, while there is no force at all when there is no current. In practice, the spring is preferably chosen to slightly bias the actuator toward one end and such behaviour is as shown in FIG. 3e.

As will be described in more detail hereinafter, if the spring is stiffer than the magnetic spring constant, displacement can be varied linearly with hold current. This feature can be used in fuel injector and other applications to provide controllable, variable lift.

—Modifying Actuator Behaviour—

Actuation speed can be modified by adjustments that make the armature lighter and so obtain larger acceleration according to $F=m \cdot a$, where m is mass of the armature arrangement (armature and other parts) and a is acceleration.

The actuation force can be modified by stacking the actuators and so increase area, A, since the force scales as $F=AB^2$.

Variable Lift

Referring to FIGS. 1, 2, 4a, 4b and 4c, operation of the solenoid actuator 1 and the flux-switched solenoid actuator 11 will now be described.

Figure 4A:
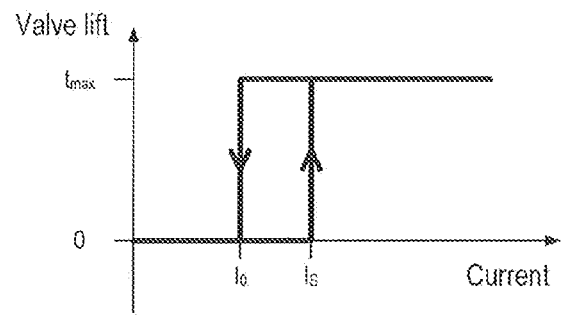
FIG. 4a shows a plot of displacement against current for the solenoid actuator shown in FIG. 1.
Figure 4B:
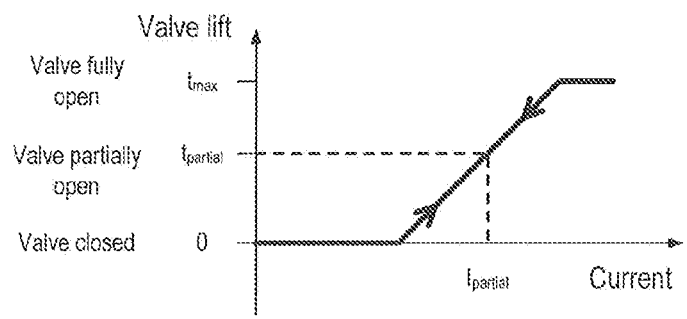
FIG. 4b shows a plot of displacement against current for the solenoid actuator shown in FIG. 2.
Figure 4C:
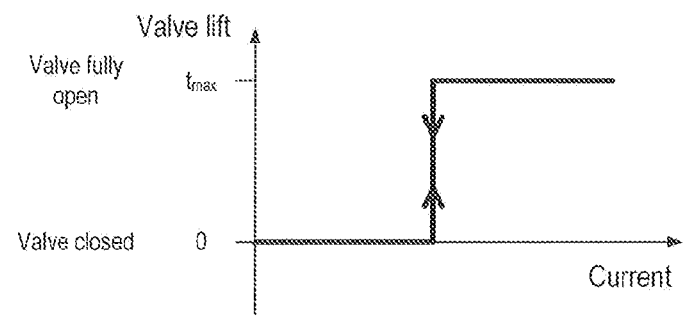
FIG. 4c shows a plot of displacement against current for the solenoid actuator shown in FIG. 2 with a softer mechanical spring than shown in FIG. 4b such that the mechanical spring stiffness balances the magnetic spring stiffness.

FIG. 4a shows the behaviour of the single-acting solenoid actuator 1. For the reasons given earlier, displacement exhibits a step-like, hysteretic dependence on current. FIG. 4b shows the behaviour of the flux switch solenoid actuator 11 with a spring which is stiffer than the magnetic spring. There is no hysteresis and displacement exhibits a linear dependence on current. FIG. 4c shows the behaviour of the flux switch solenoid actuator 11 in which the spring rates of the spring and the magnetic spring are about the same.

The total size of the air gap 7, 17 which forms part of the magnetic circuit remains the same during operation since a reduction of the lower air gap 7 between the first pole piece 4 and the armature 5 is always accompanied by an increase in the air gap 17 between the armature 5 and the second pole piece 14.

As shown earlier, the force on the armature is linear in both position and current. When acting against a mechanical spring 6, 16 which is stiffer than the magnetic spring, the quasi-static position of the armature 5 is substantially linear or at least monotonic with the coil current over all or some of the length of travel. Thus, the actuator 11 allows linear control over the armature position (lift) with current through the coil. In comparison, the solenoid as shown in FIG. 1 allows no such fine control over the armature position and the relation between valve position and current is both non-linear and hysteretic.

Lateral Flexure Arrangements

Figure 5A:
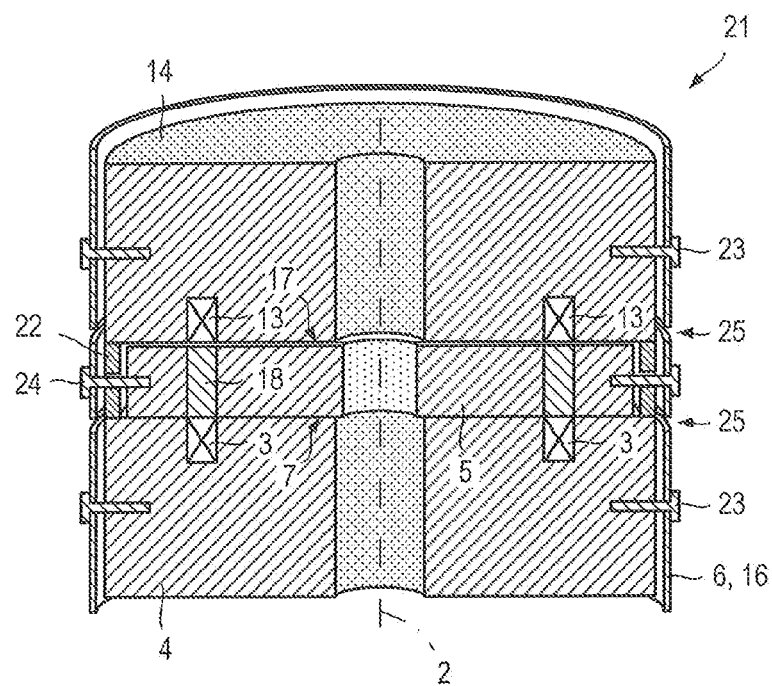
FIG. 5a is a perspective section of a solenoid actuator which includes a first type of cylindrical flexure arrangement.
Figure 5B:
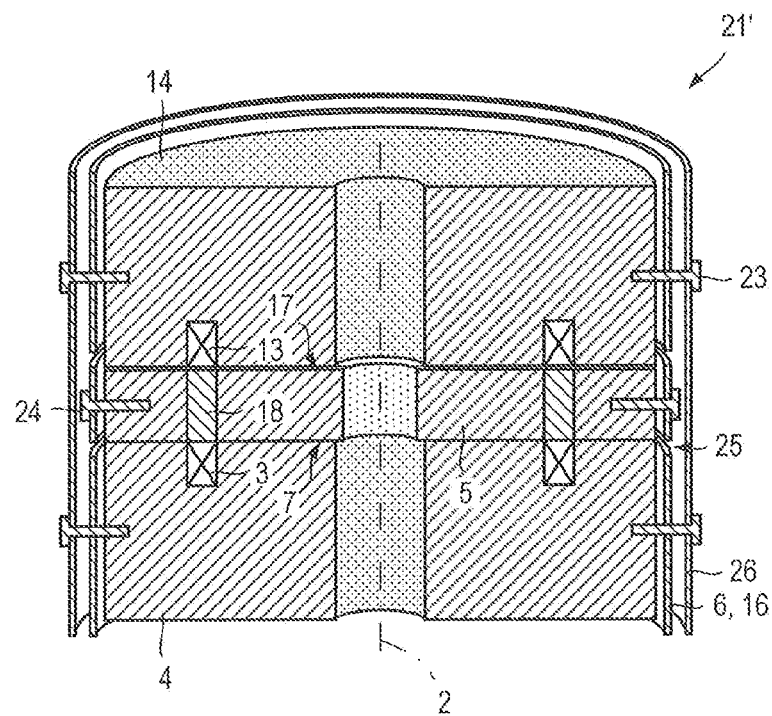
FIG. 5b is a perspective section of a solenoid actuator which includes a second type of cylindrical flexure arrangement.

FIGS. 5a and 5b illustrate first and second solenoid actuators 21, 21'.

Each solenoid actuators 21, 21' is generally cylindrically symmetric about a central axis 2.

Each solenoid actuator 21, 21' comprises a first electromagnetic coil 3 wound around the axis 2, a first pole piece 4 associated with the first coil 3, an armature 5 axially spaced apart from the first pole piece 4. A first air gap 7 having a gap size, t, is formed between the first pole piece 4 and armature 5.

Each solenoid actuator 21, 21' includes a second electromagnetic coil 13 wound around the axis 2, a second pole piece 14 associated with the second electromagnetic coil 13. In this example, the spring constants are the same. A second air gap 17 having a gap size, u, is formed between the second pole piece 14 and the armature 5. In this example, $u=t_{max}-t$. Thus, when $t=t_{max}$, $u=0$ and when $t=0$, $u=t_{max}$.

Each solenoid actuator 21, 21' includes two permanent magnets 18 having inwardly-orientated magnetisations 19.

The solenoid actuators 21, 21' can have dimensions and be formed from materials as described herein and/or as described in WO 2011/058344 A1 ibid.

In the first solenoid actuator 21, the spring 6, 16 take the form of a sheath-like cylindrical flexure 6, 16 surrounding the pole pieces 4, 14 and armature 5. The flexure 6, 16 has a diameter which is slightly larger than that of the pole pieces 4, 14. Values of spring rate are described herein.

An annular spacer 22 maintains a fixed space between the pole pieces 4, 14 which accommodates the armature 5. The pole pieces 4, 14 and armature 5 are secured to the cylindrical flexure 6, 16 by screws 23, 24 or other securing means. As shown in FIG. 5a, the screws 24 used to secure the armature 5 to the cylindrical flexure 6, 16 pass through, but are not secured to, the spacer 22, thereby allowing the screws 24 and the armature 5 to move. The cylindrical flexure 6, 16 includes at least two spaced-apart sets of part-circumferential slots 25 which allow the flexure 6, 16 to flex along its length.

In the second solenoid actuator 21', the springs 6, 16 also take the form of a sheath-like cylindrical flexure 6, 16 surrounding the pole pieces 4, 14 and armature 5. However, a rigid outer tube 26 is used to maintain a fixed distance between the pole pieces 4, 14. As shown in FIG. 5b, the cylindrical flexure 6, 16 is interposed between the outer tube 26 and the pole pieces 4, 14 and armature 5. The pole pieces 4, 14 and armature 5 are secured to the cylindrical flexure 6, 16 by screws 23, 24 or other securing means. The screws 24 used to secure the armature 5 to the flexure 6, 16 are not secured to the rigid outer tube 26.

Figure 5C:
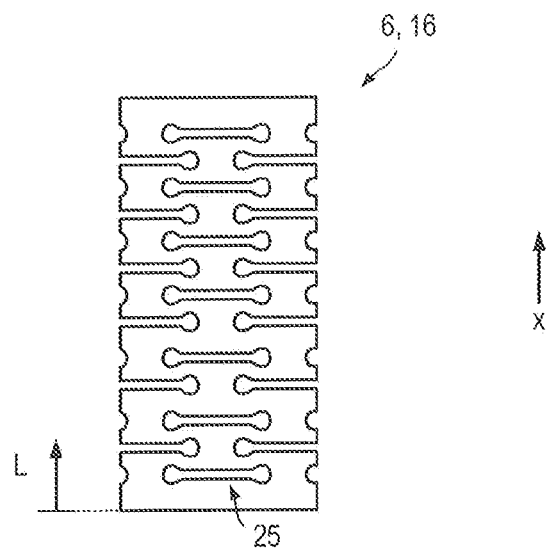
FIG. 5c is a side view of a cylindrical flexure.
Figure 5D:
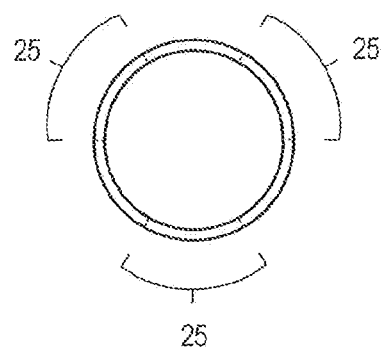
FIG. 5d is a plan view of a cylindrical flexure.

As shown in FIGS. 5c and 5d, the cylindrical flexure 6, 16 may include parallel, inter-digitated (i.e. interlocking) sets of slots 25. Each set of slots 25 lie at a different position (L) along the flexure and may comprise, for example, 2, 3, 4 or more slots 25. Each set of slots 25 is circumferentially offset (i.e. rotated) with respect to adjacent sets of slots.

End Flexure Arrangement

Figure 6:
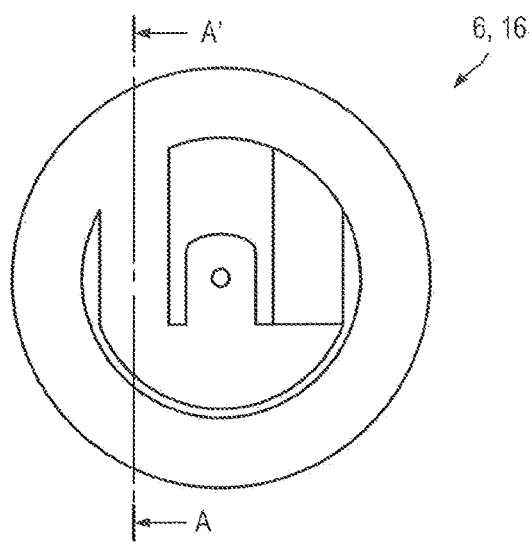
FIG. 6 is a plan view of a plate flexure.
Figure 6A:
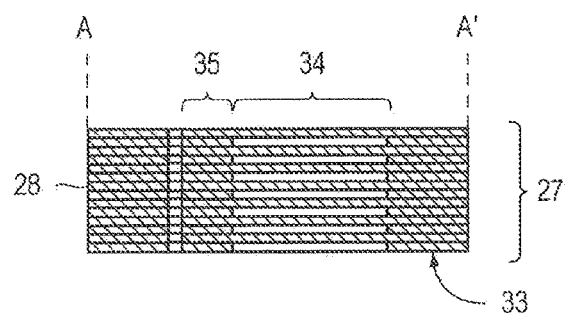
FIG. 6a is a cross-sectional view of the plate flexure shown in FIG. 6 taken along the line A-A'.
Figure 6B:
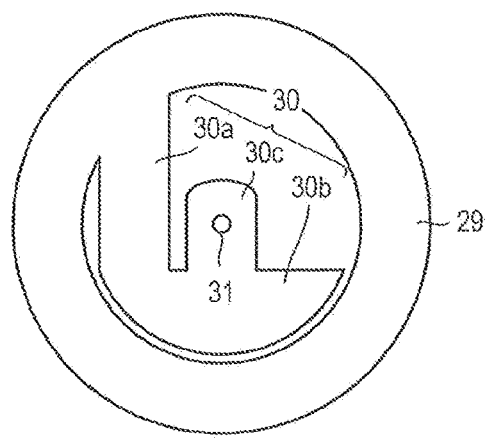
FIG. 6b is a plan view of a plate used to form the plate flexure shown in FIG. 6.

Referring to FIGS. 6, 6a and 6b, a plate-based flexure is shown. As will be explained in more detail later, the plate-based flexure can be attached to the end(s) of a solenoid actuator described herein or described in WO 2011/058344 A1 ibid. As shown in FIG. 6, the plate-based flexure is generally circular in plan view and is intended to be used with a cylindrical solenoid actuator. However, the plate-based flexure can be rectangular, e.g. square, in plan view.

Figure 7:
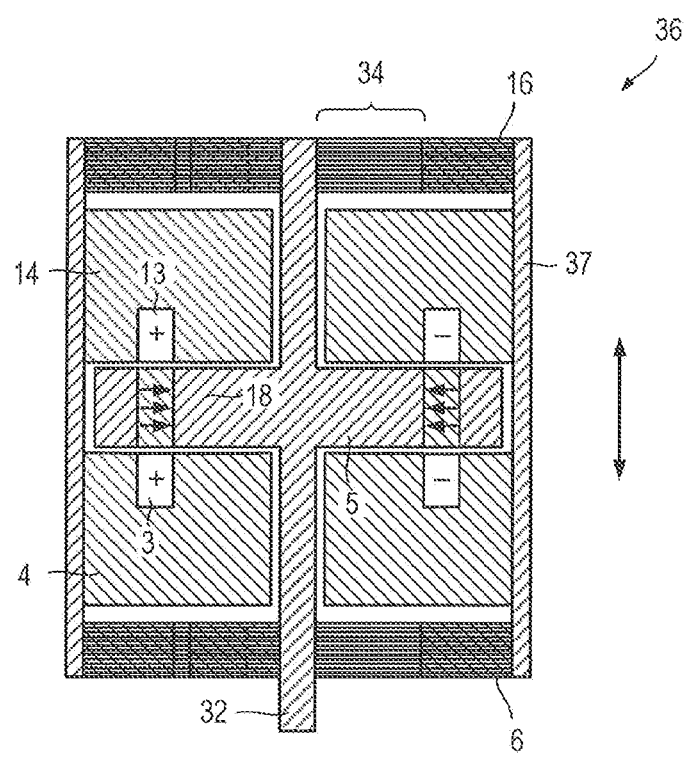
FIG. 7 is a cross-sectional view of a solenoid actuator which includes springs in the form of plate flexures.

The plate-based flexure 6, 16 comprises a stack 27 of plates 28. Each plate 28 includes an outer ring 29 and an inner, flexible arm 30. The flexible arm 30 is generally 'F'-shaped having a top crossbar portion 30a attached to the ring 29, a stem portion 30b and a central crossbar portion 30c. The central crossbar portion 30c includes a central point 31 for attachment to a moveable shaft 32 (FIG. 7). The outer ring 29 of an end plate 28, i.e. the plate 28 which lies at an actuator-facing end 33 of the stack 27, is fixed to a pole piece 4, 14. The flexible arms 30 allow the central point 31 to move with respect to the outer ring 29. The plate-based flexure 6, 16 is formed by stacking plates 28 in alternating orientations, namely stacking plates alternatively in obverse and then in reverse.

As shown in FIG. 6a, the stack 28 includes first and second vertical sections 34, 35 through the stack 27. The first section 34 of the stack 28 contains fewer layers than the second section 35. Thus, the first section 34 provides a flexible portion of the flexure (herein also referred to as "the moveable arm") and the second section 35 provides a stiff portion of flexure.

Figure 6C:
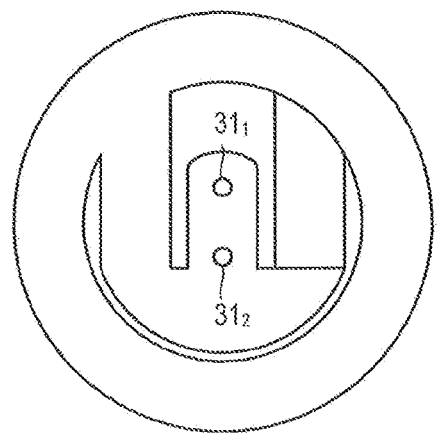
FIG. 6c is a plan view of another plate flexure.

Referring to FIG. 6c, another plate-based flexure is shown which comprises two attachment points $31_1$, $31_2$ for attaching, for example, to a double shaft (not shown).

The plate-based flexure can have the advantage that it does not significantly increase the diameter of the actuator 11.

Referring to FIG. 7, a solenoid actuator 36 is shown which employs the end flexure arrangement described with reference to FIG. 6.

The solenoid actuator 36 comprises a first electromagnetic coil 3 wound around the axis 2, a first pole piece 4 associated with the first coil 3, an armature 5 axially spaced apart from the first pole piece 4. A first air gap 7 having a gap size, t, is formed between the first pole piece 4 and armature 5. The solenoid actuator 36 includes a second electromagnetic coil 13 wound around the axis 2, a second pole piece 14 associated with the second electromagnetic coil 13. A second air gap 17 having a gap size, u, is formed between the second pole piece 14 and the armature 5. The solenoid actuator 36 includes two permanent magnets 18 having inwardly-orientated magnetisations 19.

The solenoid actuator 36 can have dimensions and be formed from materials as described herein and/or as described in WO 2011/058344 A1 ibid.

The end flexure 6, 16 is fixed, for example using screws (not shown), to an outer casing 37 which is also connected to the pole pieces 4, 14. The outer casing 37 maintains the separation of the pole pieces 4, 14. The movable arm 34 of the flexure is fixed to a central shaft 32 passing through the actuator 36 which is connected to the armature 5. The armature 5 and central shaft 32 may be formed from multiple sections.

Permanent Magnet Arrangements

WO 2011/058344 A1 ibid. describes a solenoid actuator which includes an armature comprising 2 or 4 permanent magnets.

FIGS. 8a and 8b show circular- and rectangular-shaped (in plan view) armatures 5 respectively. The armatures 5 include a magnet arrangement 38 having a high number (i.e. >5, e.g. 6) of permanent magnets 18. The permanent magnets 18 are angularly spaced around the centre 39 of the armature (which defines the axis of travel) and have inwardly-directed magnetizations 19. The magnetizations 19 need not necessarily be radially orientated. The area $A_1$ of the soft material $40_1$ inside the magnet arrangement 38 is preferably about the same as the area $A_2$ of soft material $40_2$ outside the magnet arrangement 38. For example, $0.8 \leq A_1/A_2 \leq 1.2$.

Other magnet arrangements can be used in which magnets 18 are arranged around the sides of a regular polygon with their magnetisations pointing inward and in which the area of the soft material inside the polygonal magnet arrangement is about the same as the material outside the magnet arrangement.

Permanent Magnet Material

The permanent magnets of the solenoid actuators described herein are preferably formed from samarium cobalt (SmCo). Using samarium cobalt magnets can have one or more advantages. For example, samarium cobalt tends to offer better resistance to corrosion. Moreover, samarium cobalt generally can offer better temperature characteristics, such as a reduced temperature coefficient and a higher maximum temperature. For instance, the temperature coefficient of Br of SmCo magnets is only about $-0.03\%/°$ C. compared with, for example, about $-0.11\%/°$ C. for NdBFe magnets. This means that the temperature coefficient for the magnetic spring coefficient is reduced to about $-0.06\%/°$ C. for SmCo magnets compared with about $-0.22\%/°$ C. for NdBFe magnets. This results in a variation in the spring constant of $\pm 5.4\%$ over a range of $-40°$ C. to $150°$ C. for SmCo magnets compared with $\pm 20\%$ with the NdBFe magnets. The temperature coefficient of spring stiffness is typically about $-0.02\%/°$ C. for stainless steel. The temperature coefficients have the same polarity.

This helps to compensate for the magnetic spring temperature coefficient of the magnet. The minimum thickness of a SmCo magnet may be 1.5 mm.

Controlling Multiple Actuators

Referring to FIG. 9, a circuit 41 is shown which can be used to supply power to a set of N flux-switched solenoid actuators 42, each solenoid actuator comprising a solenoid actuator described herein or described in WO 2011/058344 A1 ibid. In this case, the circuit 41 supplies power to N=4 solenoid actuators 42. However, the circuit 41 can be extended to supply power to N=2, 3, 5 or more solenoid actuators 42. Such a circuit 41 can be used control a set of solenoid actuators 42 each fuel injector provided for a respective fuel injector.

As shown in FIG. 9, an arrangement of switches 43, for example in the form of field effect transistors (FETs), is used. The circuit 41 employs ten switches 43 to control four actuators 42. This is achieved using an H-bridge arrangement in which two switches 43 are shared by adjacent actuators 42. Thus, 2(N+1) switches 43 are used to control N solenoid actuators 42.

Even though fewer switches 43 are used than, for example, a circuit using 2(N+2) switches 43, the circuit 41 can still deliver a desired waveform of either polarity independently to each solenoid actuators 42.

The appreciation that fewer switches can be used is based, at least in part, on the insight that it not necessary to inject fuel into more than one cylinder at any one time in an engine comprising four cylinders.

The circuit 41 can help to reduce costs of a controller forming part of an engine management system.

Stationary Magnet Arrangement

Figure 10:
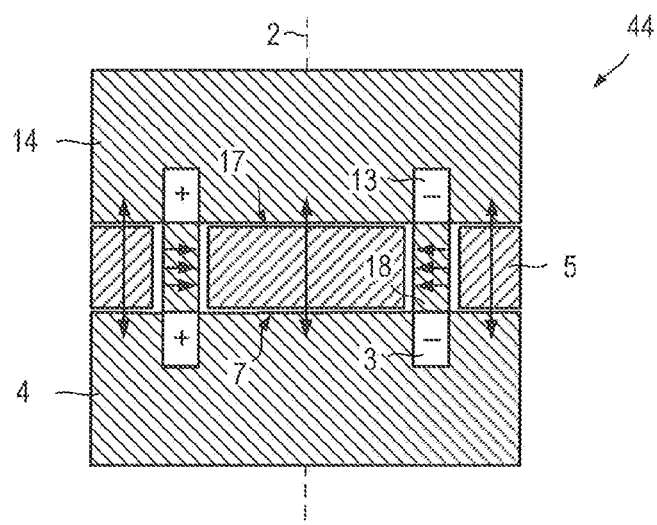
FIG. 10 is a cross-sectional view of a solenoid actuator in which permanent magnets are fixed in position.
Figure 10A:
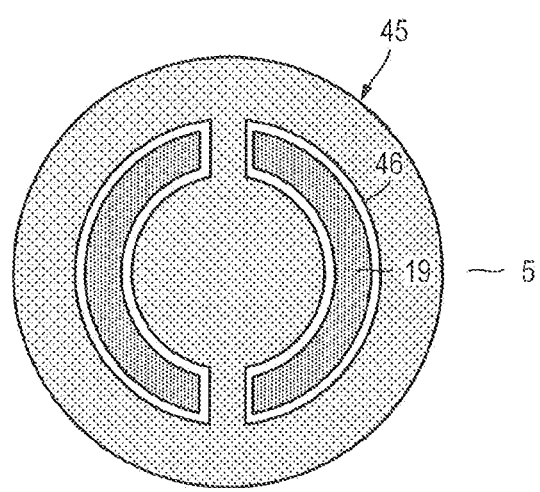
FIG. 10a is a plan view of an armature and permanent magnets shown in FIG. 10.

Referring to FIGS. 10 and 10a, a solenoid actuator 44 is shown.

The solenoid actuator 44 comprises a first electromagnetic coil 3 wound around the axis 2 a first pole piece 4 associated with the first coil 3, an armature 5 axially spaced apart from the first pole piece 4. A first air gap 7 having a gap size, t, is formed between the first pole piece 4 and armature 5. The solenoid actuator 44 includes a second electromagnetic coil 13 wound around the axis 2, a second pole piece 14 associated with the second electromagnetic coil 13. A second air gap 17 having a gap size, u, is formed between the second pole piece 14 and the armature 5. The solenoid actuator 44 includes two permanent magnets 18 having inwardly-orientated magnetisations 19. The permanent magnets 18 are fixed and do not move with the armature 5.

The solenoid actuator 44 can have dimensions and be formed from materials as described herein and/or as described in WO 2011/058344 A1 ibid.

As shown in FIG. 10b, the permanent magnets 18 are contained within an outer perimeter 45 of the armature 5. The armature 5 includes arcuate slots or other form of apertures 46 which accommodate the permanent magnets 18. However, other permanent magnet shapes and sizes may be used. For example, rectangular magnets and rectangular slots may be used.

As shown in FIGS. 10 and 10a, the electromagnet coils 3, 13 and permanent magnets 18 are held stationary in relation to the pole pieces 4, 14, while the armature 5 can move axially. This arrangement can help to allow higher acceleration since the mass of the armature can be reduced by moving the permanent magnets 18 from the moving part of the actuator.

Multiple-Actuator, Extended-Actuator and Multiple-Armature Arrangements

The solenoid actuators hereinbefore described and described in WO 2011/058344 A1 ibid. generally comprise a single actuator unit comprising a pair of pole pieces, permanent magnet(s), coil(s) and a single armature. However, solenoid actuators comprising multiply-linked actuator units or extended actuator units can be used to provide faster acceleration or greater force, as will now be described in more detail:

Multiple Actuator Arrangement

Figure 11:
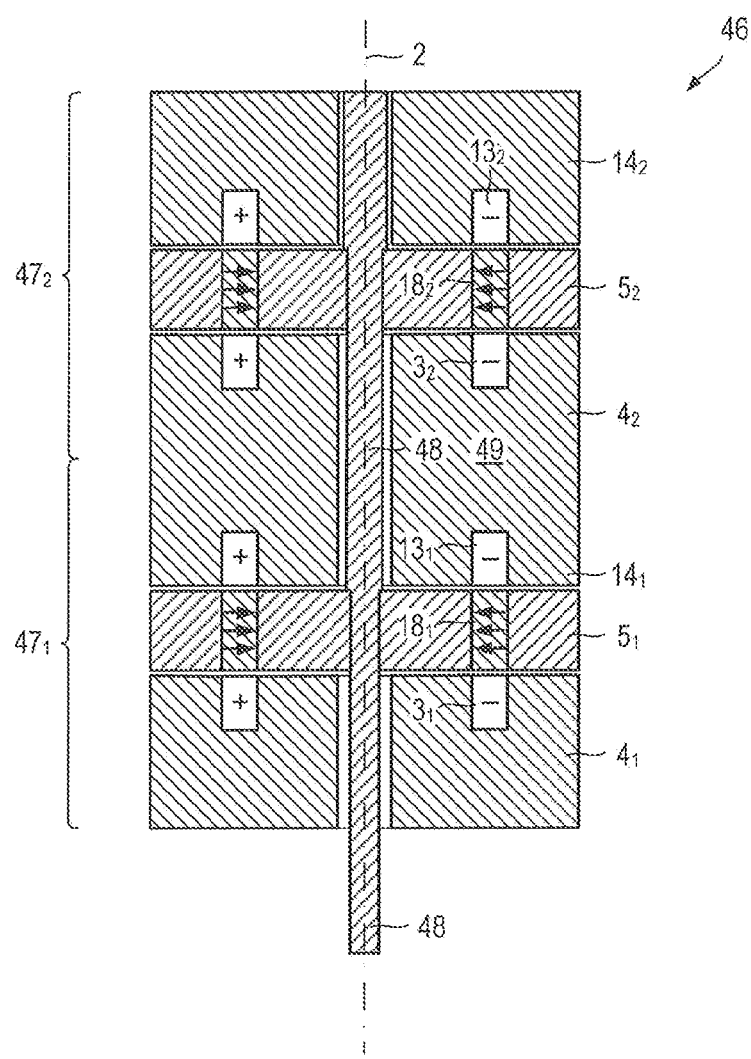
FIG. 11 is a cross-sectional view of a series arrangement of two solenoid actuators.

Referring to FIG. 11, a first multiple actuator arrangement 46 is shown.

As shown in FIG. 11, the multiple actuator arrangement 46 comprises a stack of first and second actuators 47$_1$, 47$_2$. The first and second actuators 47$_1$, 47$_2$ are linked via a link member 48 in the form of a shaft.

The first solenoid actuator 47$_1$ comprises a first electromagnetic coil 3$_1$ wound around an axis 2, a first pole piece 4$_1$ associated with the first coil 3$_1$, an armature 5$_1$ axially spaced apart from the first pole piece 4$_1$. The first solenoid actuator 47$_1$ also comprises a second electromagnetic coil 13$_1$ wound around the axis 2, a second pole piece 14$_1$ associated with the second electromagnetic coil 13$_1$. The first solenoid actuator 47$_1$ includes two permanent magnets 18$_1$ having inwardly-orientated magnetisations.

Likewise, the second solenoid actuator 47$_2$ comprises a first electromagnetic coil 3$_2$ wound around the axis 2, a first pole piece 4$_2$ associated with the first coil 3$_2$, an armature 5$_2$ axially spaced apart from the first pole piece 4$_2$. The first solenoid actuator 47$_2$ also comprises a second electromagnetic coil 13$_2$ wound around the axis 2, a second pole piece 14$_2$ associated with the second electromagnetic coil 13$_2$. The second solenoid actuator 47$_2$ includes two permanent magnets 18$_2$ having inwardly-orientated magnetisations.

In FIG. 11, a common flexure 6, 16 is omitted for clarity. However, a longitudinal flexure, such as a cylindrical flexure as hereinbefore described, end flexure(s) as hereinbefore described or other form of spring arrangement can be used.

As shown in FIG. 11, the second pole piece 14$_1$ of the first actuator 47$_1$ and the first pole piece 4$_2$ of the second actuator 47$_2$ is provided by a single, common piece of magnetic material.

The first multiple actuator arrangement 46 can deliver an increased force for a given diameter of actuator. Thus it can be employed in situations where constraints are placed on actuator diameter, such as in fuel injectors.

The multiple actuator arrangement 46 can be used in a wet-type actuator, for example, as herein after described.

Extended Actuator

Figure 12:
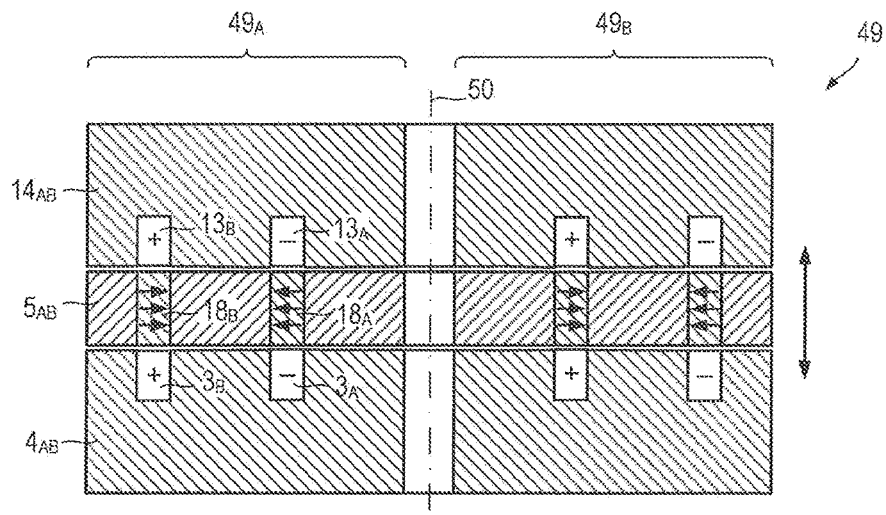
FIG. 12 is a cross-sectional view of an extended solenoid actuator.
Figure 12A:
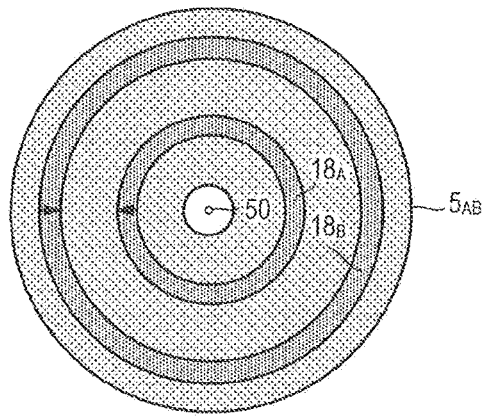
FIG. 12a is a plan view of an armature and permanent magnets shown in FIG. 12.

Referring to FIGS. 12 and 12a, an extended actuator 49 is shown.

Figure 12B:
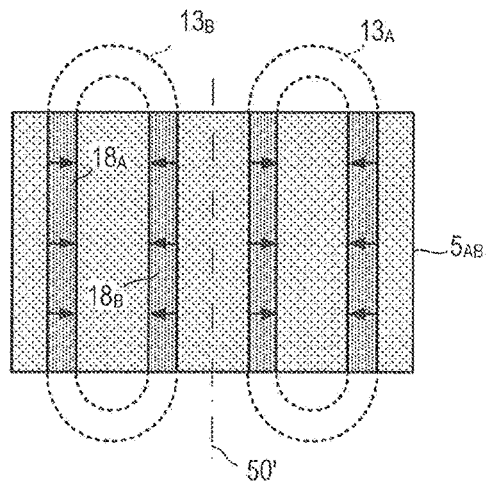
FIG. 12b is a plan view of a rectilinear armature.

As shown in FIGS. 12 and 12a, the extended actuator 49 can be seen as a parallel arrangement of first and second actuators 49$_A$, 49$_B$ arranged around, in the case of a rotationally-symmetric actuator, a central axis 50 or, in the case of a rectangular actuator, a central plane 50' (FIG. 12b).

The extended actuator 49 comprises a first and second pairs of electromagnetic coils 3$_A$, 3$_B$ wound around the axis 50, a first extended pole piece 4$_{AB}$ associated with the first pair of electromagnetic coils 3$_A$, 3$_B$, an extended armature 5$_{AB}$ axially spaced apart from the first pole piece pole piece 4$_{AB}$. The first extended actuator 49 also comprises a second pair of electromagnetic coils 13$_A$, 13$_B$, a second pole piece 14$_{AB}$ associated with the second pair of electromagnetic coils 13$_A$, 13$_B$. The extended actuator 50 includes first and second pair of permanent magnets 18$_A$, 18$_B$ having magnetisations outwardly and inwardly orientated.

As shown in FIG. 12a, the actuator 49 is generally symmetric about a central axis 50. In this case, the actuator has a central hole or lumen, L. However, the actuator 50 can be arranged to be rectilinear having a rectangular armature having striped permanent magnets 18a, 18 as shown in FIG. 12b.

In FIG. 12, the flexure 6, 16 is omitted for clarity. However, a longitudinal flexure, such as a cylindrical flexure and/or end flexure(s) as herein described or another form of spring arrangement can be used.

Thus, the extended actuator 49 can provide a larger actuation force due to a larger pole piece area. By effectively combining two actuators in this way, the armature can be provided which has less mass per unit area of the armature. Thus, fast actuation can still be achieved.

Narrow Multiple Actuator Arrangements

Figure 13:
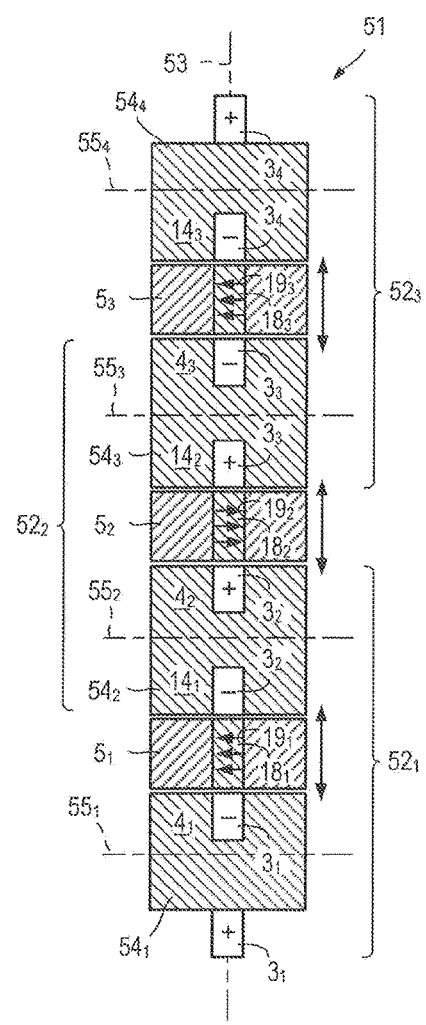
FIG. 13 is a cross-sectional view of a series arrangement of three solenoid actuators with a simplified electromagnet coil arrangement.

Referring to FIG. 13, a multiple-actuator arrangement 51 is shown.

As shown in FIG. 13, the multiple actuator arrangement 51 comprises a stack of amalgamated first, second and third actuator units 52$_1$, 52$_2$, 52$_3$. Each unit actuator unit 52$_1$, 52$_2$, 52$_3$ is arranged around a respective armature 5$_1$, 5$_2$, 5$_3$ and the armatures 5$_1$, 5$_2$, 5$_3$ are linked by an arrangement (not shown) so that they move together along a common longitudinal axis 53.

Each armature 5$_1$, 5$_2$, 5$_3$ is interposed between blocks 54$_1$, 54$_2$, 54$_3$, 54$_4$ of soft magnetic material which provide lower and/or upper pole pieces 4$_1$, 14$_1$, 4$_2$, 14$_2$, 4$_3$, 14$_3$. A first block 54$_1$ provides a lower pole piece 4$_1$ of a first actuator unit 52$_1$. However, second and third blocks 54$_2$, 54$_3$ each provide an upper pole piece 14$_1$, 14$_2$ of one actuator unit 52$_1$, 52$_2$ and a lower pole piece 4$_2$, 4$_3$ of another, adjacent actuator unit 52$_2$, 52$_3$ thereby contributing to the amalgamated structure of the arrangement 51. A fourth block 54$_1$ provides an upper pole piece 14$_3$.

Electromagnetic coils 3$_1$, 3$_2$, 3$_3$, 3$_4$ are wound around respective transverse axes 55$_1$, 55$_2$, 55$_3$, 55$_4$ passing through each block 54$_1$, 54$_2$, 54$_3$, 54$_4$ of soft magnetic material. As shown in FIG. 13, a first coil $3_1$ is wound around a first transverse axis $55_1$ and is associated with the first lower pole piece $4_1$. Second and third coils $3_2$, $3_3$ are wound around second and third transverse axes $55_1$, $55_2$ respectively and are associated with the second and third lower pole pieces $4_2$, $4_3$ respectively. The second and third coils $3_2$, $3_3$ not only each provide a lower coil, but also effectively provide an upper coil associated with the first and second upper pole pieces $14_2$, $14_3$ respectively. A fourth coil $3_4$ is wound around a fourth transverse axis $55_4$ and is associated with the third upper pole piece $14_3$. As shown in FIG. 13, the first and third coils $3_1$, $3_3$ are wound in a first sense (or "direction") and the second and fourth coils $3_2$, $3_4$ is wound in a second, opposite sense.

Each armature $5_1$, $5_2$, $5_3$ includes a permanent magnet $18_1$, $18_2$, $18_3$ disposed in the centre of the armature $5_1$, $5_2$, $5_3$ with its magnetisations $19_1$, $19_2$, $19_3$. However, as shown in FIG. 13, orientations of the magnetisations $19_1$, $19_2$, $19_3$ alternate through the arrangement 51 so that orientations of adjacent magnets $18_1$, $18_2$, $18_3$ are anti-parallel.

The linking arrangement (not shown) may be a double shaft running through the pole pieces $4_1$, $14_1$, $4_2$, $14_2$, $4_3$, $14_3$ either side of the coils.

In FIG. 13, the flexure 6, 16 is omitted for clarity. However, a longitudinal flexure, such as a cylindrical flexure and/or end flexure(s) as herein described or another form of spring arrangement can be used. Use of end flexures is preferred so as to minimise the diameter of the arrangement 51.

The multiple-actuator arrangement 51 and the actuators 56 (FIG. 14), 59 (FIG. 15) can provide increased force for a given diameter or width of actuator. Stacking the actuators units, each with pole piece area A, delivers more force by increasing the total surface area to 3A. Stacking the actuators units also allows higher acceleration because thinner armatures can be used compared with a single actuator, for example actuator 11 (FIG. 2), of the same diameter or width. The multiple-actuator arrangement 51 can be employed in situations where constraints are placed on actuator diameters, such as in fuel injectors.

The multiple-actuator arrangement 51 can be modified by omitting the first and fourth coils $3_1$, $3_4$ thereby leaving only two coils.

Figure 14:
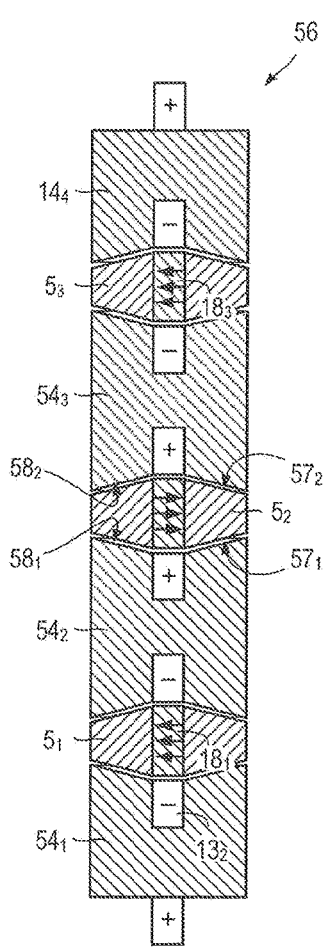
FIG. 14 is a cross-sectional view of a series arrangement of three solenoid actuators with a simplified electromagnet coil arrangement and tapered armatures.

Referring to FIG. 14, another multiple-actuator arrangement 56 is shown.

The multiple-actuator arrangement 56 is the same as the arrangement 51 shown in FIG. 13 except that the armatures $5_1$, $5_2$, $5_3$ are tapered so that they have shaped lower and upper surfaces $57_1$, $57_2$ and the blocks $54_1$, $54_2$, $54_3$, $54_4$ of soft magnetic material have correspondingly-shaped upper and lower surfaces $58_1$, $58_2$ to seat the armatures $5_1$, $5_2$, $5_3$. The magnets $18_1$, $18_2$, $18_3$ may remain the same shape and size.

Thus, the mass of the armatures $5_1$, $5_2$, $5_3$ is reduced which can make the actuator faster for a given force.

Multiple-Armature Arrangement

Figure 15:
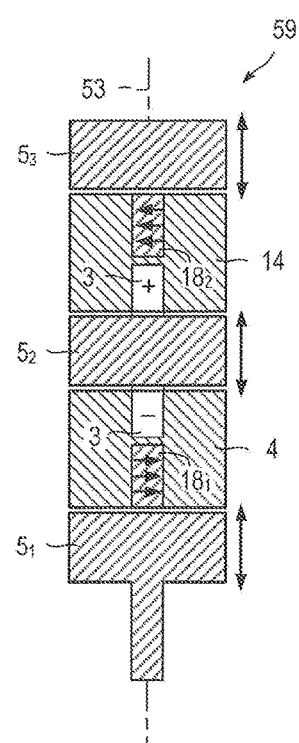
FIG. 15 is a cross-sectional view of a solenoid actuator having a three-piece, stacked armature and a simplified electromagnet coil arrangement.

Referring to FIG. 15, a triple-armature actuator 59 is shown. The actuator 59 may be used in, for example, a direct diesel injector.

The actuator 59 includes a stack comprising, in order, a first armature $5_1$, a first pole piece 4, a second (or "central") armature $5_2$, a second pole piece 14 and a third armature $5_3$. The armatures $5_1$, $5_2$, $5_3$ are linked by an arrangement (not shown) so that they move together along a common axis 53. An electromagnetic coil 3 is wound around the central armature $5_2$. The first and second pole pieces 4, 14 include first and second permanent magnet $18_1$, $18_2$ respectively.

The coil 3 is arranged in the pole pieces 4, 14 adjacent to the central armature $5_3$ and the first and second permanent magnets $18_1$, $18_2$ are arranged in respective pole pieces 4, 14 adjacent to the first and third armatures $5_1$, $5_3$. The linking arrangement (not shown) may be a double shaft running through the pole pieces 4, 14 either side of the coils.

In FIG. 15, the flexure 6, 16 is omitted for clarity. However, a longitudinal flexure, such as a cylindrical flexure and/or end flexure(s) as herein described or another form of spring arrangement can be used. Use of end flexures is preferred so as to minimise the diameter of the actuator 59.

The actuator 59 can provide a larger force due to the increase in surface area created by triple-armature arrangement. The actuator 59 can also exhibit fast acceleration since the permanent magnets 181, 182 are disposed in the pole pieces which can help to reduce the mass of the armature.

In the examples shown in FIGS. 13, 14 and 15, the pole pieces and armatures are generally circular in plan view and the coils and magnets run across the diameter of the device. However, the pole pieces and armatures can be rectangular in plan view.

Mechanical Spring Constants

A short-travel flux switch actuator can exhibit one or more advantages over a single-acting solenoid actuator having the same pole area which may be particularly useful in fuel injector applications. For example, a short-travel flux switch actuator can achieve a larger change in force going from an undriven state to a driven state and/or exhibit faster acceleration for a given force. Furthermore, a short-travel flux switch actuator can apply a force which is a linear function of drive current and so offer greater control. It also offers an ability to generate a force in either direction.

A short-travel flux switch actuator comprises a magnetic spring exhibiting a linear or substantially linear negative spring coefficient. The spring constant at the centre of travel tends to be a minimum and the spring constant at the ends of travel tend to be greater. For a short travel actuator, the centre value of spring constant will be about 90% of the end value. The properties of the actuators described herein and in WO 2011/058344 A1 ibid. can be adapted by using springs with different spring coefficients, as will now be described:

Firstly, the actuator may not have any springs. Thus, the actuator is opened and closed by current or voltage pulses of different polarity and remain in an open or closed state until switched over.

Secondly, the actuator may have spring(s) which apply a closing force which is substantially constant over the length of travel and which is sufficient to prevent the actuator from latching in a valve open state. This could be achieved by, for example, a coil spring which is pre-compressed by an amount significantly larger than the length of travel of the actuator.

This can provide an actuator (and, thus, a valve) having an extremely high sealing force in the closed position for a given diameter actuator. This can be beneficial where the valve needs a high sealing force to achieve low leakage or where the valve has to resist a high level of back pressure attempting to open the valve. Such a high level of pressure can be due to fuel pressure such as in an unbalanced, outward-opening gasoline direct injection (GDI) injector or to combustion pressure such as in an inward-opening direct injection unit for gaseous fuels such as hydrogen, propane or natural gas.

Such an actuator also has the feature that, when open, the magnetic latching force opposes the spring closing force.

Thus, the valve can be held open with a small current and so result in lower electrical dissipation.

Thirdly, the actuator may have spring(s) with a spring constant which is approximately equal to the negative spring constant of the magnetic spring, but with some net force sufficient to bias the injector valve towards the closed position when the actuator is undriven. This can yield highest speed operation from a given actuator (or valve) because, at one end of travel, it is possible to drive the actuator towards the other end of travel.

Finally, the actuator may have spring(s) with a spring constant which is greater than, for example 1.1, 1.5 or 2 times, the negative spring constant of the magnetic spring. This yields an actuator (or valve) in which proportional opening can be achieved simply by setting the steady-state drive current. In many applications including automotive applications, the spring force can be biased to ensure the valve close when the actuator is not driven.

Actuator Behaviour for Different Mechanical Spring Constants

Referring to FIG. 2, if the absolute value of the mechanical spring constant of an actuator 11 is higher than the absolute value of the magnetic spring constant, then the position of the armature 5 may be controlled in a stable open loop manner.

Figure 16:
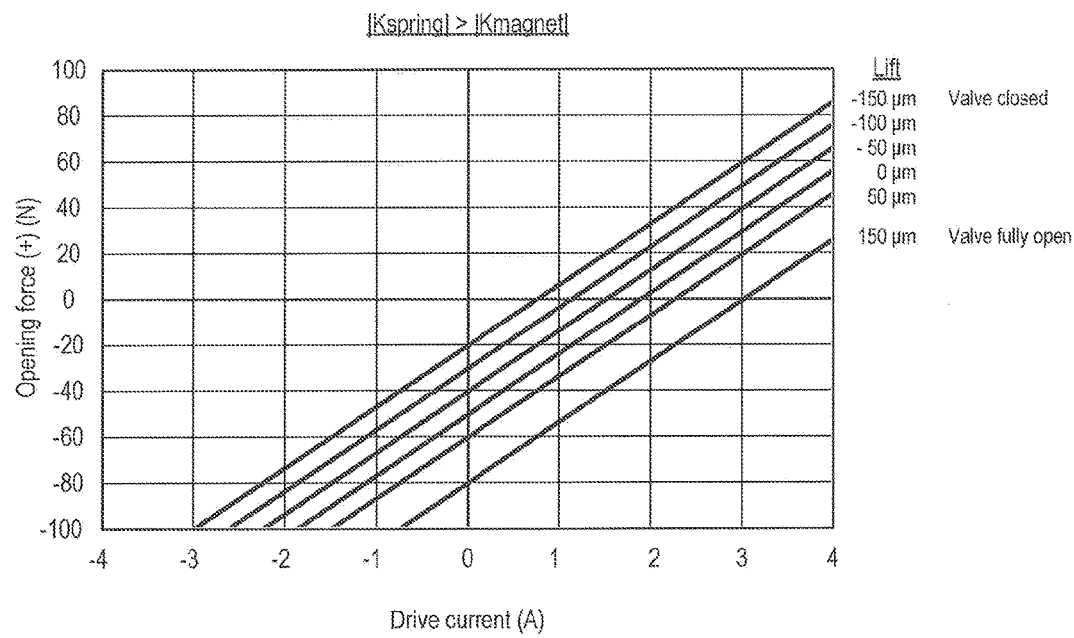
FIG. 16 shows plots of force against drive current for a solenoid actuator for different values of lift when a mechanical spring has a stiffness greater than that of a magnetic spring.

FIG. 16 shows plots of force against drive current for a solenoid actuator 11 for different values of lift when a mechanical spring 6, 16 has a stiffness greater than that of the magnetic spring. The mechanical spring 6, 16 has a spring constant of 800 Nmm$^{-1}$, the opposing magnetic spring has a spring constant of 600 Nmm$^{-1}$, the maximum travel is 310 μm, diameter of the solenoid is 24 mm, the magnet bias is 0.6 T and the N=43 turns.

As shown in FIG. 16, stable positions are achievable by selecting various different drive currents. The armature 5 takes up a stable position when the opening force is zero. The movement of the armature 5 increases as the current is increased. In comparison, the solenoid 1 (FIG. 1) provides no such fine control over the position of the armature 5 and the relation between armature (and, thus, valve) position and current is both non-linear and hysteretic.

Figure 17:
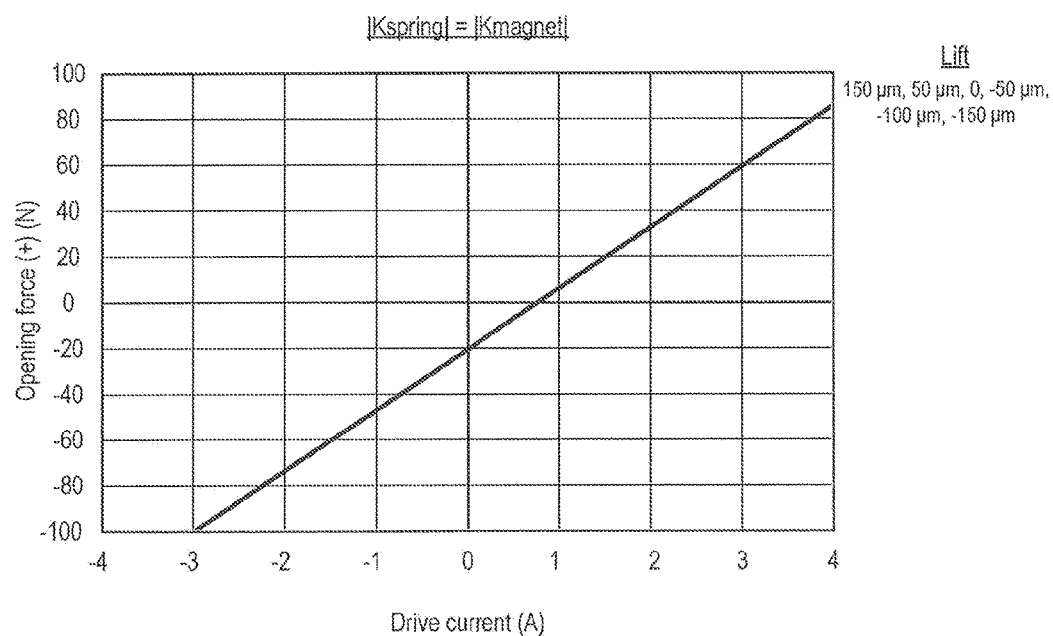
FIG. 17 shows plots of force against drive current for a solenoid actuator for different values of lift when a (mechanical) spring has a stiffness which is the same as that of a magnetic spring.

FIG. 17 illustrates the performance of the actuator n when the mechanical and magnet spring constants are matched. In this case, the mechanical spring 6, 16 has a spring constant of 600 Nmm$^{-1}$.

As shown in FIG. 17, displacement curves overlap illustrating that the actuator 11 is unable to provide open-loop position control. However, using this spring arrangement, the armature 5 can move between the ends of travel at the fastest rate.

Figure 18:
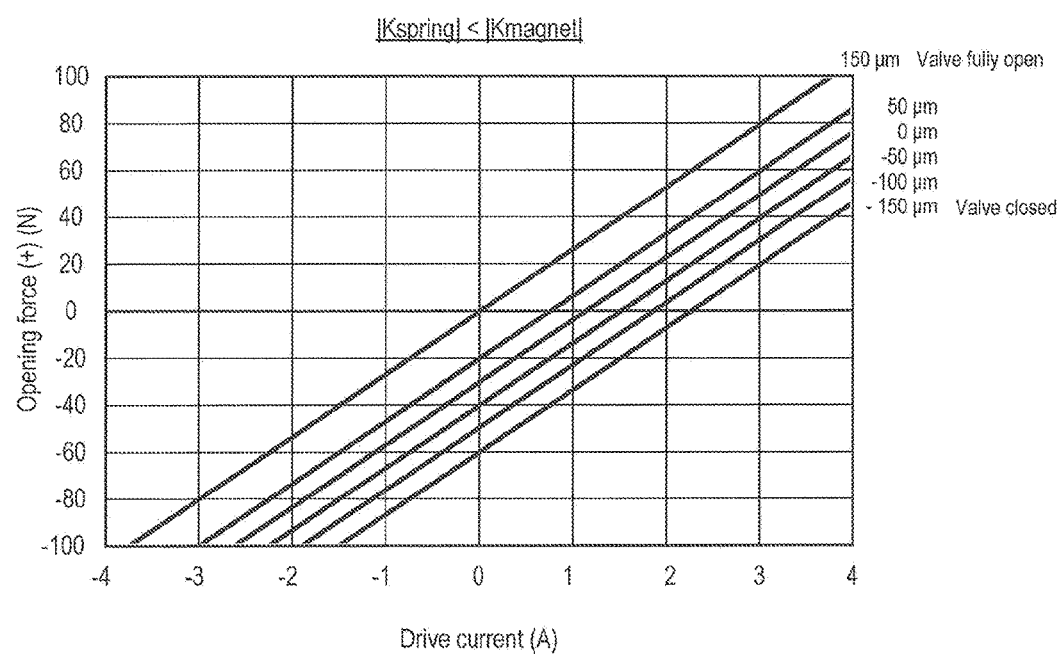
FIG. 18 shows plots of force against drive current for a solenoid actuator for different values of lift when a (mechanical) spring has a stiffness which is less than that of a magnetic spring.

FIG. 18 shows the performance of the actuator n when the mechanical spring constant is less than the magnet spring constant. In this case, the mechanical spring 6, 16 has a spring constant of 400 Nmm$^{-1}$.

When the current reaches sufficient magnitude to move the armature from a valve closed position, then lower currents are required to obtain all other positions and so an intermediate position of the armature 5 is more difficult to control in an open loop manner, but still easier than a conventional actuator 1 (FIG. 1).

Actuators having different spring constants, including the values disclosed in WO 2011/058344 A1 ibid., can be used.

Wet-Type Actuator

Figure 19:
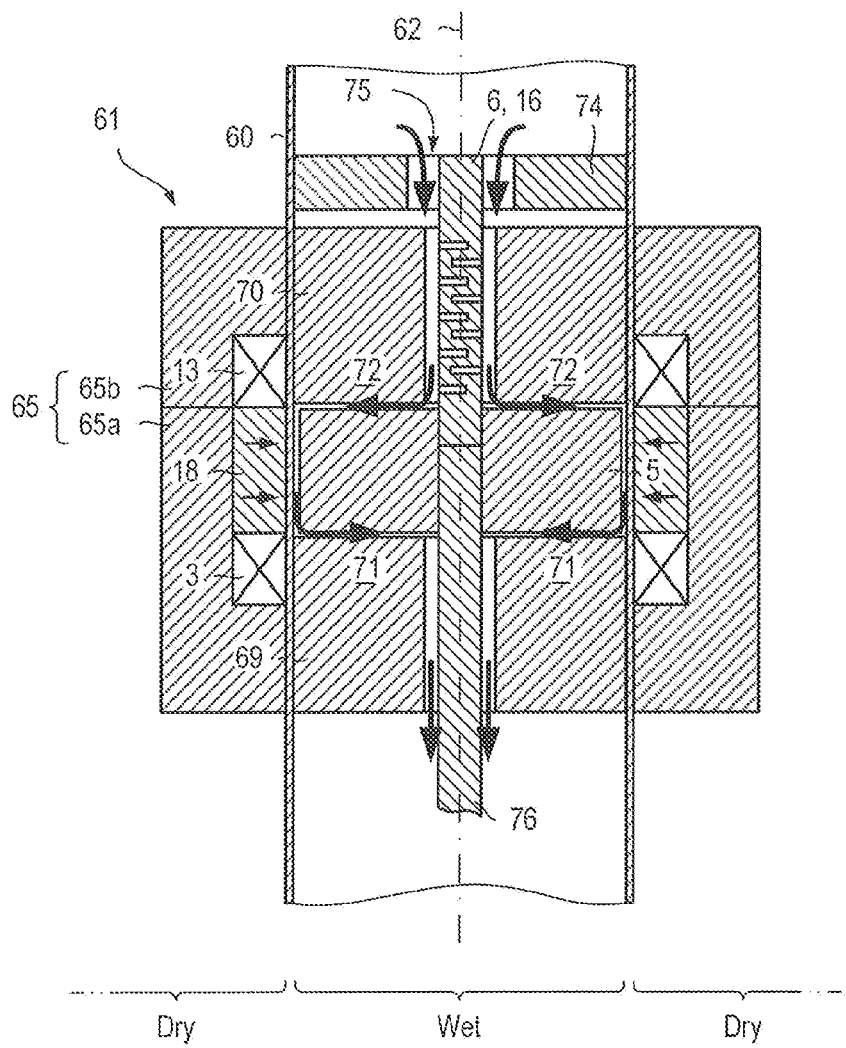
FIG. 19 is a section of a wet-type solenoid actuator and a pipe.

Referring to FIG. 19, an arrangement is shown comprising a pipe or tube 60 and an actuator 61 for controlling flow of a fluid (or "medium") through the pipe 60. The fluid may be pressurized.

The actuator 61 has an axis 62 around which first and second axially-spaced coils 3, 13 are wound inside an outer pole piece 65 (or "stator") which lies outside the pipe 60. The outer pole piece 65 is generally annular and is made up of more than one part 65a, 65b so as to fit it around the pipe 60. The outer pole piece 65 may be formed from Somaloy®. The outer pole piece 65 houses one or more permanent magnets 18 which lie either side or around the circumference of the pipe 60 between the first and second coils 3, 13. The magnet(s) 66 have inwardly-directed magnetisations.

A disc-shaped armature 5 lies inside the pipe 60 between the permanent magnet(s) 18 and between axially-spaced inner pole pieces 69, 70. The inner pole pieces 69, 70 may be formed from ferrous cobalt, ferrous cobalt chromium or other suitable material. The outer and inner pole pieces 65, 69, 70 generally form a 'C' shaped core with first and second poles 71, 72 between which the armature 5 lies.

The spring 6, 16 takes the form of a slotted rod flexure attached, at one end, to the armature 5 and, at the other end, to the inside wall of the pipe 60 via a stiff plate 74 having through channels 75 which allow fluid to flow through the plate from one side to the other. The actuator 61 also includes a pintle 76 having a head (not shown) which engages a seat (not shown). The spring 6, 16 and the pintle 76 may be unitary. This can help to make the arrangement and the actuator lighter.

The armature 5 and pole pieces 69, 70 may be made from FeCo (Vacoflux 18HR), FeCoCr (Vacoflux 9Cr) alloy. The pole pieces 69, 70 or parts of the pole pieces 69, 70 may be made from Somaloy® material. These materials tend to have high permeability, high saturation flux density and, in the case of Somaloy®, high resistivity.

If FeCo or FeCoCr is used, then the armature 5 and pole pieces 69, 70 may include radial slots to reduce eddy currents and, thus, increase the speed of the armature 5. If The tube 60 may include inward projections, such as an annular ridge, to support or locate the pole pieces 69, 70.

The tube may be of low permeability which increases the reluctance of the magnetic path. Alternatively the tube may be of higher permeability which increases the leakage flux bypassing the armature gaps. In either case, the conductivity of the tube in the region around the permanent magnets comprises a shorted turn on the drive coil, thereby increasing electrical losses. Thus, thickness of the tube is preferably reduced, ideally minimised, to increase magnetic forces. For example, the tube may include regions of minimised thickness or grooves (not shown) in the relevant regions. Sections of the tube 60 may have their magnetic characteristics modified using laser techniques or other localised material-processing techniques to achieve low permeability in the tube adjacent to the upper and lower gaps and high permeability elsewhere along the tube. A section of the tube 60 which is in contact with the coils 3, 13 and magnet 18 preferably has a low saturation flux density and/or low permeability. Other sections of the tube 60 preferably have high saturation flux density and high magnetic permeability.

The tube 60 need not necessarily have the same internal or external diameter along its length in the vicinity of the actuator 61. The tube 60 may be formed to provide shoulders or grooves to provide locations for internal and external components. The tube 60 may have constant inner diameter, but have varying wall thickness to provide greater strength, for example to resist hoop stresses in portions with larger diameters or in areas where stress raisers occur.

One of the coils 3, 13 may be omitted. This can reduce cost and/or complexity. Furthermore, using only a lower coil 3 can be help to provide a large upward actuation forces.

The outer pole piece 65 may be split at its thinnest section or elsewhere to allow assembly of the magnets 18 and the coils 3, 13. The coil(s) 3, 13 may be coiled on a former (not shown). The former (not shown) may be formed from a thin-walled polymer insulator. Alternatively, a self-supporting coil may be used.

The magnet(s) 18 may be fully-sintered, radially-magnetised rings or a ring constructed from 4, 6 or more arcuate magnets which are radially magnetised or substantially radially-magnetised (for example, by virtue of having a parallel field through a short arc). The ring magnet may be manufactured using compression or injection moulded techniques.

The tube 60 (except for the openings) and the actuator 61 may be over-moulded with a suitable polymer (with or without reinforcement with glass fibres or other suitable material) which houses the conductors which are used to connect the actuator coils 3, 13 to a suitable connector on a wiring loom using a connector.

Calibration and Timing

When an actuator, such as one of the actuators described herein or in WO 2011/058344 A1 ibid., is used in a fuel injection application, it can be helpful to provide an arrangement which allows adjustment the closing force (or "preload force") using an calibration spring.

Figure 20:
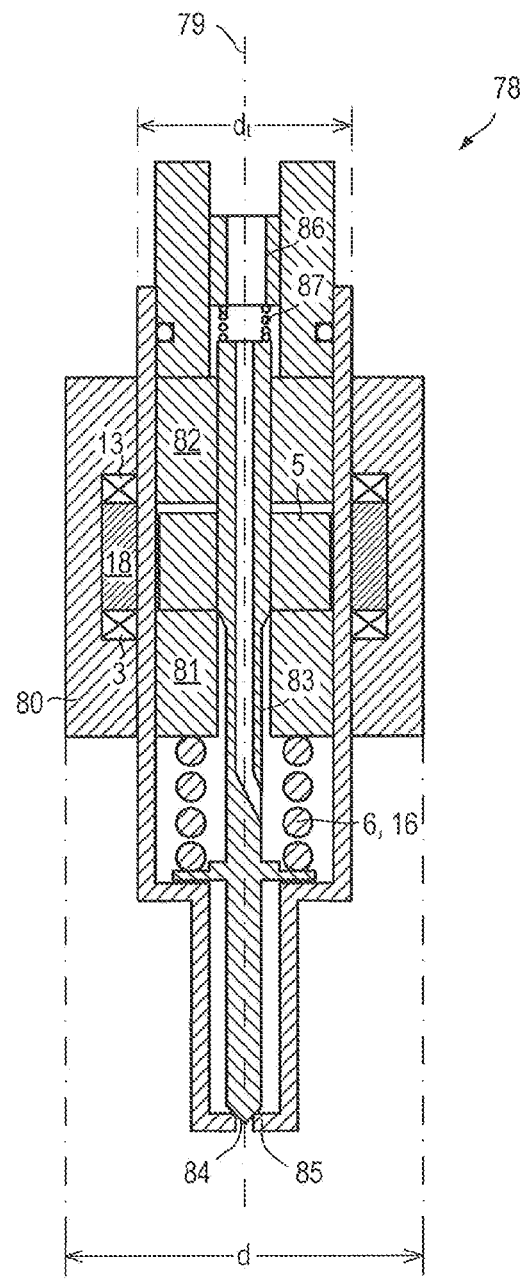
FIG. 20 is a sectional view of an injector in which a mechanical spring applies a force from one side of the armature and the force applied by the spring does not reverse over length of travel.

Referring to FIG. 20, an inward-opening injector 78 is shown which is based on a flux switch actuator.

The injector 78 has an axis 79 around which first and second axially-spaced coils 3, 13 are wound inside an outer pole piece 80. The outer pole piece 80 houses one or more permanent magnets 18 between the first and second coils 3, 13. The magnet(s) 66 have inwardly-directed magnetisations.

A disc-shaped armature 5 lies between the permanent magnet(s) 18 and between axially-spaced inner pole pieces 81, 82. The outer and inner pole pieces 80, 81, 82 generally form a 'C' shaped core with first and second poles between which the armature 5 lies.

The spring 6, 16 pre-loaded stiff coil spring. The actuator 78 also includes an inward-opening pintle 83 having a head 84 which engages a seat 85.

The closing force on the pintle 83 can be achieved by moving an adjusting pin 86 downwards, thereby increasing compression in a calibration spring 87. This alters the opening response of the injector 78 and allows the injector 78 to be trimmed so as to meet a preset performance specification.

The calibration spring 87 has a lower stiffness compared with the spring 6, 16. The spring rate of the calibration spring 87 may be chosen to trim the spring rate of the overall mechanical spring system. Thus, in addition to changing the pre-load force when the head 84 is seated, the calibration spring 87 can also be selected (for example, chosen a set of springs each having different spring rates) to trim the spring rate.

A calibration spring of chosen stiffness can also be used for an outward-opening injector such as that described in WO 2011/058344 A1 ibid.

The energy density of the permanent magnet(s) 18 may be varied by adjusting the strength of the magnetisation field intensity during production. This may be used to obtain the correct magnetic stiffness for the actuator forming the basis of the injector 78.

The coils 3, 13 and armature 5 are very closely coupled magnetically and so any back emf generated by the armature 5 when moving can be used to monitor performance over time and temperature. Thus, measurements of back emf can be used to trim performance of the actuator by adjusting drive parameters, such as hold current.

One of the coils 3, 13, for example the lower coil 3, can be omitted.

Mechanical Anti-Bounce

In an inward-opening injector employing a single-acting solenoid such as that shown in FIG. 1, a pintle can be lifted by the armature to which it is directly attached and so inject fuel. When current to the solenoid is removed, the pintle closes. However, the pintle may bounce due to the closing force of the mechanical spring towards the valve seat and the momentum of the armature and pintle. This bounce is undesirable as it may introduce a small amount of poorly-atomised fuel which may lead to cause undesirable exhaust emissions.

Figure 21:
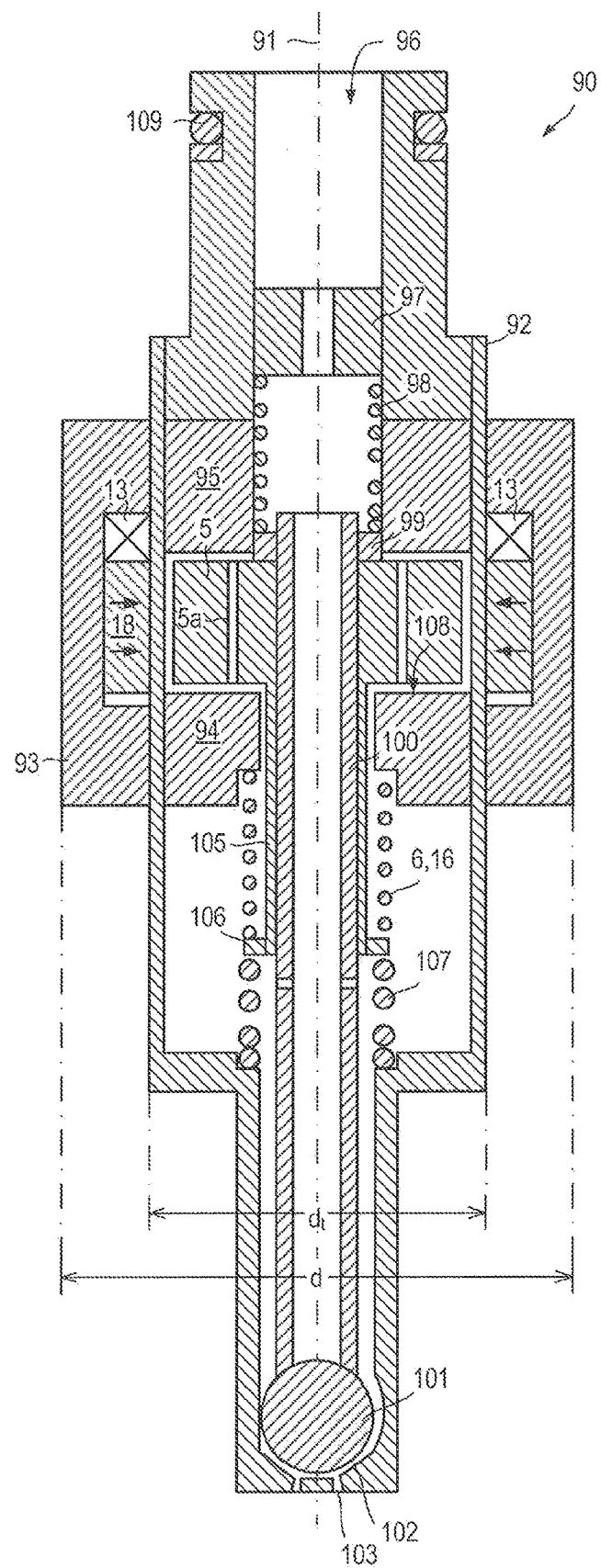
FIG. 21 is a section of a fuel injector which includes a solenoid actuator and which includes a mechanical anti-bounce arrangement.

Referring to FIG. 21, an inward-opening injector 90 is shown which includes a flux switch actuator and an anti-bounce arrangement. In FIG. 21, the injector 90 is shown in a partially-open position.

The injector 90 is generally symmetrical about a central axis 91 and comprises a thin-walled pressure tube 92. A coil 13 is wound inside an outer pole piece 93 which lies outside the pressure tube 92. Another, axially-spaced coil can also be provided on the other side of the magnet 18. The outer pole piece 93 houses a set of permanent magnets 18 having inwardly-orientated magnetizations. The pressure tube 92 houses upper and lower pole pieces 94, 95 which are attached to the inside wall of the tube 92.

The injector 90 includes a fuel inlet pathway 96 which houses a calibration plug 97 and a calibration spring 98 for applying a preload to a pintle assembly comprising a pintle collar 99, a pintle tube 100 and a pintle sealing element 101. The pintle sealing element 101 forms a metal-to-metal seal on a valve seat 102 which includes holes 103 for atomising fuel.

The injector 90 includes an armature assembly which comprises a main disc-shaped portion 5, integral sleeve 105 depending from the main armature portion 5 having a outer collar 106 at its distal end. The main armature portion 5 includes gas/liquid-damping-reducing through-holes 5a. The armature assembly 5, 105, 106 is mounted on the pintle tube 100 and is free to slide along the tube 100.

Typically, when the valve is closed, the armature 5 is in contact with the collar 99 after the initial de-bounce period.

When the coils 3, 13 are energised, the armature assembly 5, 105, 106 moves rearwardly (i.e. in a direction away from the valve seat 102) and, via the pintle collar 99, lifts the pintle assembly 99, 100, 101 away from the valve seat 103. A spring 6, 16 acts directly on the armature arrangement via the armature collar 106 and is compressed.

When the coils 3, 13 are de-energised, the spring 6, 16 and calibration spring 98 bias the pintle assembly 99, 100, 101 and the armature assembly 5, 105, 106 towards the valve seat 103, i.e. into a sealing position. When the sealing element 101 comes in to contact with the valve seat 102, the pintle assembly 99, 100, 101 comes to rest. However, the armature assembly 5, 105, 106 is free to continue to moving forward (i.e. in a direction towards the valve seat 105).

A spring 107, which also acts on the armature arrangement 5, 105, 106 via the armature collar 106, may be used to absorb the kinetic energy of the armature assembly 5, 105, 106. The damping spring 107 biases the armature assembly 5, 105, 106 away from the valve seat 105 so the armature 5 rests against of the collar 99 ready for the start of the next injection cycle. Losses due to the fuel viscosity can help to dissipate energy. Thus, when the armature returns into contact with the pintle, the pintle does not lift off the seat.

The spring 6, 16 may be omitted, for example, based on the spring forces required.

The actuator may be a statically-stable variable lift type actuator if the sum of the spring rates for the springs 6, 16, 98, 107 (where fitted) exceed that of the magnetic spring. Alternatively, the sum of the spring rates for the springs 6, 16, 98, 107 (where fitted) may be less than that of the magnetic spring giving a response similar to that shown in FIG. 18.

The actuators and the injectors shown in FIGS. 20 and 21 may have a tube diameter, $d_t$, of between 9 and 18 mm and may have an outer diameter, d, of between about 16 and 26 mm. Typically, the outer diameter, d, is about 22 mm. The actuator may have a stroke between 0.025 and 0.8 mm. The stroke may be larger, for example up to a 1 mm or more, or smaller. However, the injector can be controlled to provide partial lift, for example, using a control unit hereinafter described.

The injector 90 includes an 'O'-ring 109 which provides a seal when the injector is connected to a fuel source (not shown).

The spring 6, 16 may take the form of diaphragm spring(s). The spring 6, 16 and/or the spring 107 may be disposed upstream of the armature 5.

A two-piece arrangement of armature and pintle need not be used, i.e. the armature 5 and the pintle assembly 99, 100, 101 can be formed so as to move together.

One of the coils 3, 13, for example the lower coil 3, can be omitted.

Stabilizing of Magnetic Performance

The permanent magnets 18 may be stabilised by heating the permanent magnets 18 for a period at an elevated temperature above normal operating temperature. This process may be referred to as "soaking". Optionally, the magnets 18 may be heated with a reverse field being applied from a coil set (not shown) or placing the magnets in a self-demagnetising arrangement, for example, either well separated from each other or opposing each other.

Longer Length of Travel

The solenoid actuators described in WO 2011/058344 A1 ibid. are generally short-travel solenoid actuators. Typically, for a short-travel solenoid actuator, d/Δt is at least 100 and can be more than 1000, where Δt is the length of travel (or "stroke") (i.e. along an axis of travel) and d is the external width or diameter of the actuator. The external width of the actuator usually corresponds to the outer diameter of the pole piece(s).

However, for solenoid actuators described herein and solenoid actuators described in WO 2011/058344 A1 ibid. which have been modified, d/Δt can be 20 or more. For example, the stroke can be as large as 0.8 mm for an actuator having a diameter of about 16 mm.

Thus, the solenoid actuators and the injectors which include such solenoid actuators herein described may be configured to have longer strokes, for example, d/Δt<100. d/Δt may be at least 20.

Water and Air Valve Actuation

The actuators herein described may be used to control valves which inject water or aqueous mixtures of water and alcohol and/or water-soluble oil into a combustion chamber of an engine. The mixture may take the form of an emulsion. The actuators herein described may be used to inject fuel or air.

Electrical Relay

The actuators herein described are very high speed and may be used to switch electrical contacts thus forming a relay. The actuator preferably has a length of travel of at least 0.5 mm or at least 1 mm and/or up to 1 mm, 2 up to mm or up to 3 mm.

Referring to FIG. 7, the actuator 36 may be used as a single-pole, single-throw relay comprising first and second terminals (not shown). The shaft 32 is attached to a flexible electrical contact (not shown) connected to the first terminal. A free end of the electrical contact is separated from a fixed electrical contact connected to the second terminal. The electrical contacts are separated by a gap. When the coils 3, 13 are energised, the shaft 32 urges the flexible contact into direct contact with the fixed contact thereby closing the switch and connecting the terminals. When the coils 3, 13 are de-energised, the shaft 32 returns to its original position drawing back the flexible contact and breaking the connection.

Other actuators described herein or in WO 2011/058344 A1 ibid. may be used. Other forms of flexures can be used. More complex, multi-pole and/or multi-throw relays may be used.

The actuators herein described can provide large latching forces. If dual-latching is required, then the actuator is configured such that the stiffness of the magnetic spring is greater in magnitude than higher than the stiffness of the spring.

The actuator may be arranged to latch in both open and closed positions.

Driver Electronics, Driver Waveforms and Back emf Waveforms

Figure 22:
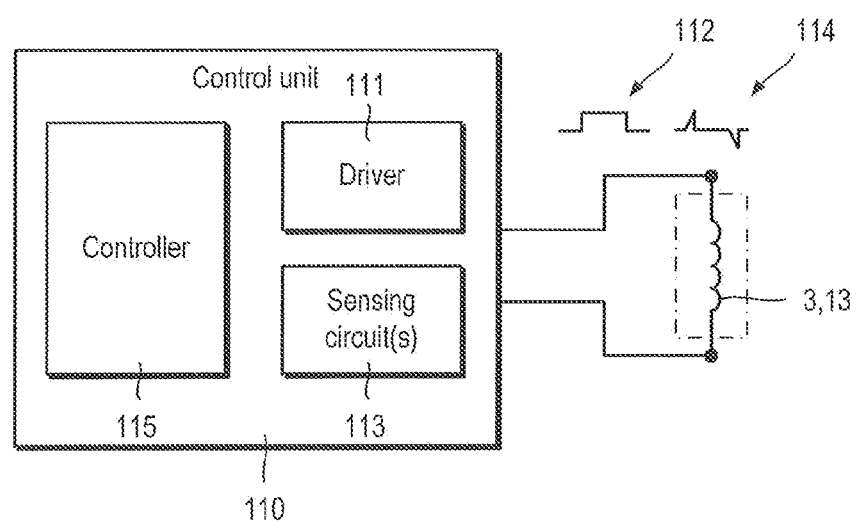
FIG. 22 is a schematic block diagram of a control unit.

Referring to FIG. 22, a control unit no for one or more coils 3, 13 of an actuator is shown. The control unit no can be used to control any of the actuators or arrangements of actuators described herein or in WO 2011/058344 A1 ibid. which may have one coil 3, 13 or more than one coil 3, 13. If an actuator includes more than one coil 3 or if the control unit controls more than one actuator, the control unit may drive the coils 3, 13 in the same way or in complementary ways (i.e. inverted).

The control unit no includes a driver in for supplying a drive waveform 112 to the coil(s) 3, 13 and a sensing circuit 113 for measuring back emf waveform 114. The driver 111 and sensing circuit 113 are controlled by a controller 115.

The driver 111 and the drive waveforms 112 supplied to the actuator are preferably optimised to obtain a desired performance, such as to provide fastest movement between ends of travel, fastest movement to an intermediate position between the ends of travel and additional negative force to stop the actuator moving from its normally stable position.

The sensing circuit 113 and the back emf waveforms 114 may be used to identify speed of movement and may be integrated to calculate position. The back emf waveforms 114 may be used to adjust the driving of the actuator, for instance, to accommodate for change of magnetic or mechanical spring properties with temperature. The back emf may also be used to compensate for longer term mechanical and magnetic degradation.

A low-impedance voltage driver 111 can provide velocity control simply from the back emf given the close electromechanical coupling between the armature 5 and the coils 3, 13. This can be exploited during opening and closing portions of the injection cycle, for instance during actuator opening, by bringing the voltage down to (or close to) zero after the initial high voltage period, to allow currents to flow from the back emf braking the armature velocity prior to entering the constant current hold phase.

In the following actuator driving techniques and circuits are described for use in a fuel injector in an automotive application. However, the driving techniques and circuits are suitable for and can be used in other non-automotive applications.

Injector Drive Techniques and Circuits

Figure 23:
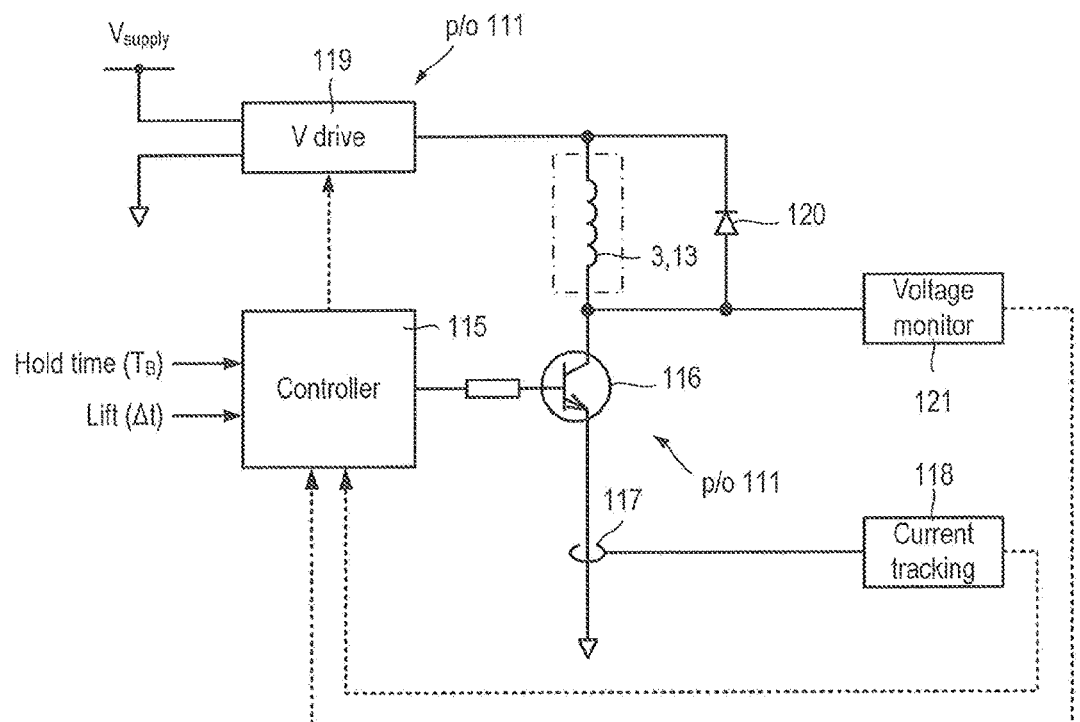
FIG. 23 is a schematic circuit diagram of a first control unit for controlling a solenoid actuator.

FIG. 23 shows a first example of a control unit 110.

Figure 23A:
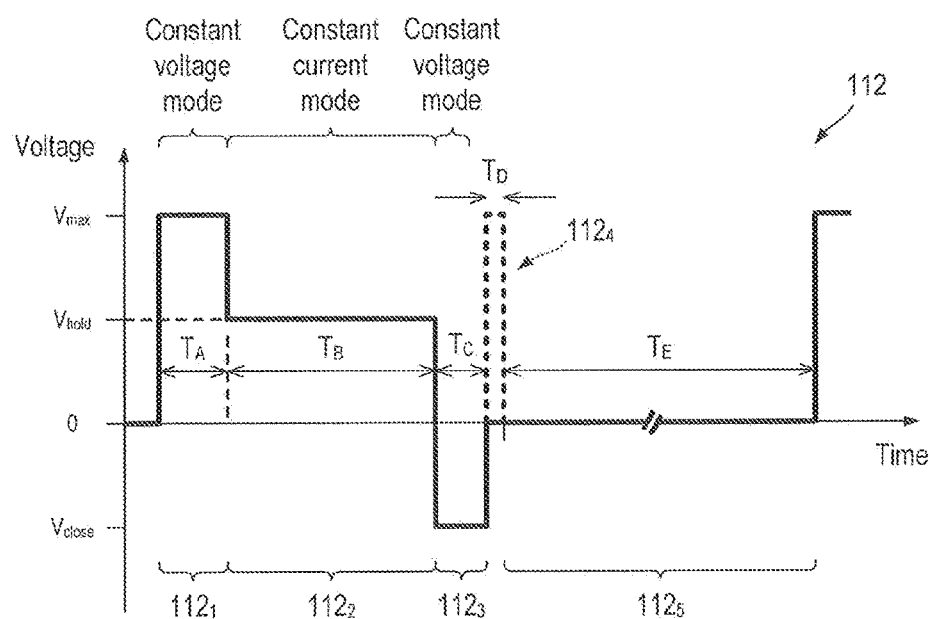
FIG. 23a illustrates a drive waveform for the first control unit shown in FIG. 23.

Referring also to FIG. 23a, the controller 110 the coil(s) 3, 13 to be driven in constant voltage mode during turn on and turn off and in a constant current mode during the hold phase. The amount of current during the hold phase is set by the controller 115 which controls a voltage supplied to the base of transistor 116. A current sensor 117 can detect current flowing through the coil(s) 3, 13 and a circuit 118 can be used for slow temperature tracking of the performance of the circuit, i.e. it is not needed as a fast dynamic control.

A voltage driver 119 provides the turn-on voltage, $V_{max}$. The turn-on voltage may be set by the controller 115 according to (vehicular) driving conditions. The transistor 116 is initially overdriven by the current demand waveform, as it takes a finite time for the current to build up to the requested level. A clamp diode 120 in parallel with the coil(s) 3, 13 is used for turn off. A Zener diode (not shown) can be included in series with the diode 120 for a higher turn off voltage for faster turn off.

Referring in particular to FIG. 23a, the drive waveform 112 or ("drive signal") includes a plurality of portions $112_1$, $112_2$, $112_3$, $112_4$, $112_5$ including a turn-on portion $112_1$, a hold portion $112_2$, an optional turn-off portion $112_3$, an optional anti-bounce portion $112_4$ and an off portion $112_5$.

The turn-on and hold portions $112_1$, $112_2$ can take the form of a simple pulse, e.g. a square pulse having an amplitude, V, and duration, T. The amplitude V sets the current which controls the degree to which an injector is open, e.g. open or partially open (i.e. partial lift), and the duration, T, sets the duration of injection.

However, the turn-on and hold portions $112_1$, $112_2$ can take the form of a stepped pulse, for example, as shown in FIG. 23a. The amplitude and duration of the turn-on portion $112_1$ are arranged such that, at the end of the turn-on portion $112_1$, the armature is in the correct hold position and at rest, and the current in the coil 3, 13 equals the hold current. Pulse width modulation (PWM) can be used to form hold portion $112_2$. The voltage of the turn-on portion $112_1$ can have a different amplitude from the of the hold portion $112_2$ to adjust the time taken for current to build up. A lower voltage provides a dip in the drive before the constant hold current steps in, a higher voltage permits a higher initial current to be reached. This can be useful as it can be used to minimise the residual oscillations of the injector when it arrives at the partial lift point. Minimising residual oscillation can also be achieved by varying the V drive set point. This can be done by monitoring oscillations using a voltage monitor 121 as the injector enters the constant current phase. A higher initial voltage indicates an upward moving armature, a lower voltage indicates a downward moving armature. This can be used to trim the set point of the V drive 119 such that following pulses have lower oscillations.

$V_{hold}$ may be set to be less than or equal to the battery voltage. The control unit 110 is preferably arranged such that $V_{max}$ is supplied by a booster circuit (not shown).

As shown in FIG. 23a, the turn-off portion $112_3$ can be of the opposite polarity to the turn-on and hold portions $112_1$, $112_2$, in case negative. A short anti-bounce voltage $112_4$ can be provided to help the valve to seat within a preset range of velocity, e.g. between 0.5 and 1.5 ms$^{-1}$, and/or to ensure that the current in the coil 3, 13 is at or close to zero. Typically, $T_C$ (or $T_C+T_D$) is about equal to $T_A$.

Figure 24:
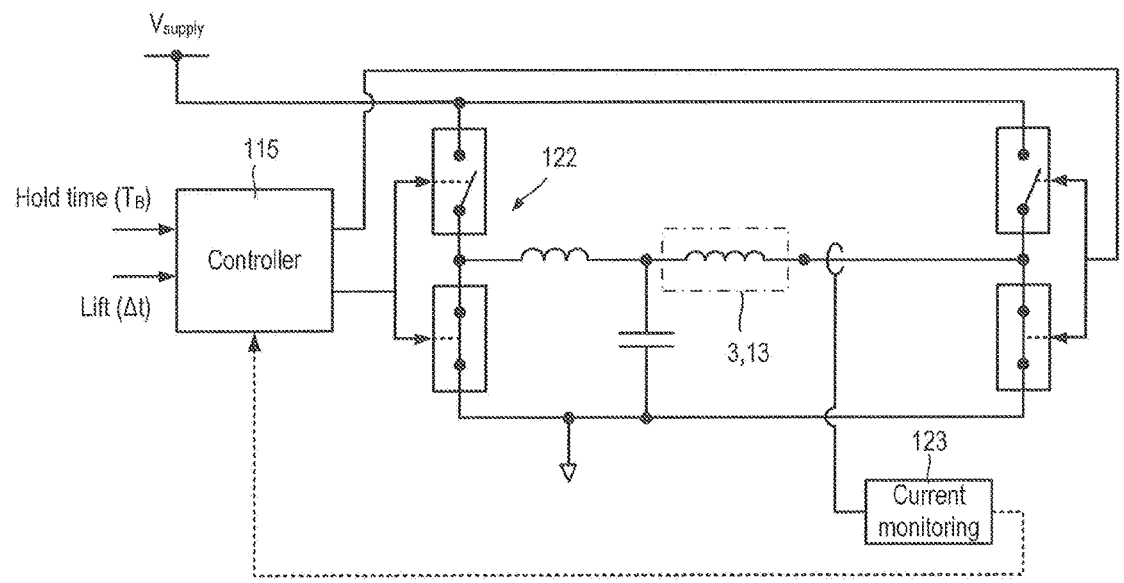
FIG. 24 is a second schematic circuit diagram of a second control unit for controlling a solenoid actuator.

FIG. 24 shows a second example of a control unit 110.

The control unit 110 shown in FIG. 24 provides the same functionality as the control unit no shown in FIG. 23, but can have lower losses. However, the control unit 110 shown in FIG. 24 uses faster control loops to adjust half bridge switching 122 to provide the variable voltage drive and particularly fast control to provide the constant current drive using real time sensing of actuator current.

Figure 24A:
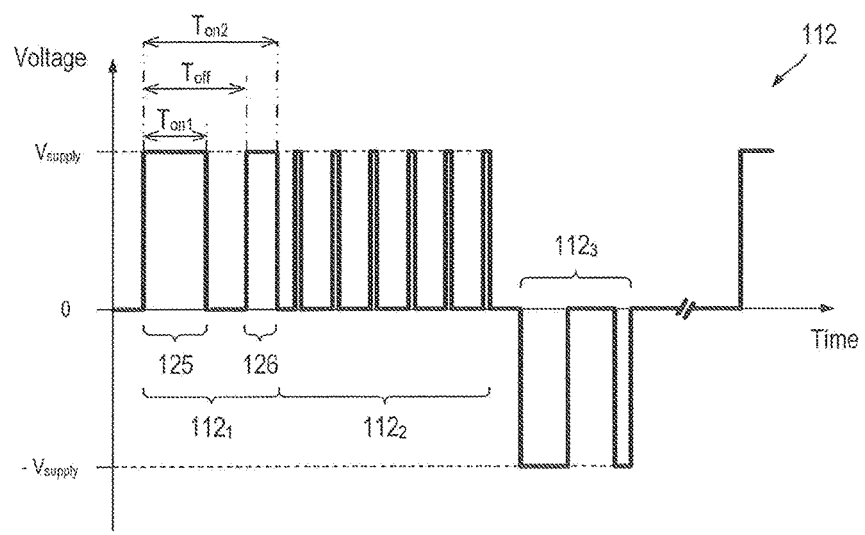
FIG. 24a illustrates a drive waveform for the second control unit shown in FIG. 24.

Referring also to FIG. 24a, pulse width modulation (PWM) is used to provide turn-on and hold phases $112_1$, $112_2$ of the drive waveform. The turn-on portion $112_1$ is arranged such that, at the end of the turn-on portion $112_1$, the armature is in the correct hold position and at rest, and the current in the coil 3, 13 equals the hold current. A turn-off portion $112_3$ of the waveform is used to close the actuator/injector. This is an inverted version of the turn-on portion $112_1$ with pulse durations adjusted to close the valve in a bounce-free manner.

As shown in FIG. 24a, the turn-on portion $112_1$ of the waveform includes first and second pulses 125, 126. The first pulse 125 has a duration $T_{on1}$. The second pulse 126 starts at a time $T_{off}$ and ends at a time $T_{on2}$ after the start of the first pulse 125 and has a duration ($T_{on2}-T_{off}$).

The value of $T_{on1}$ is used to control the degree of lift (i.e. set the target lift or "hold position"). Thus, greater lift is achieved using a larger value of $T_{on1}$. The value of $T_{off}$ is used to control the velocity of the armature 5 at the end of the turn-on portion $112_1$. The value of $T_{on2}$ is used to set the desired current for holding the armature in its hold position.

In each case, by the end of the turn-on portion $112_1$, the armature has zero velocity, the armature has reached the hold position and the current has reached the appropriate level to maintain this lift in the hold phase $112_2$.

The control units no shown in FIGS. 24 and 25 both provide sensing of the back emf vs current and time, permitting the dynamics of the armature 5 to be monitored, as well as more straightforward open/short monitoring. This information can be used to update drive characteristics as the injector ages (valve seat wear, magnet degradation, filter loading), fuel property variations, as well as coping with temperature variations on the injector, fuel, and to a lesser extend the drive electronics.

A control unit can be used which provide a constant voltage turn on followed by a second constant voltage for the hold drive. The benefit of the constant voltage in the hold phase is that the back emf of the actuator coils naturally provide damping of the motion of the actuator. During partial lift operation, this provides extra stability of the system in the case that the initial drive causes the actuator to overshoot the desired lift position.

Additionally, a slow control loop can be run by a control unit which monitors the current during the voltage hold phase, so that subsequent injections can have their voltage hold setting adjusted to compensate for variations in resistance of the actuator due to e.g. temperature of the coil and wiring.

This technique can also be applied to the opening voltage phase.

During opening it is often desirable to apply maximum volts available. In these circumstances, the effective opening voltage can be adjusted by varying the duration of the maximum voltage phase.

Monitoring the current during the constant voltage opening phase, the point where the pintle leaves the seat can be detected, and used in either a fast loop to adjust the timing on a pulse by pulse basis, or more conservatively to adjust the drive parameters of succeeding pulses, or simply as a condition monitor.

Driving methods will now be described in more detail.

The driving methods are appropriate for actuators which exhibit monotonic lift with current.

—High Impedance (Current Drive)—

A simple driving method can be used when the actuator is damped and a slow response is acceptable. The simple driving method comprises driving a current through the coils 3, 13 which provides the desired amount of travel (i.e. target opening) and waiting until desired amount of travel is achieved. The current may be found from a predetermined quasi-static, relationship between current and travel, for example, in the form of a look-up table (not shown).

Mechanical damping can be used to adjust for overshoot/slow settling. For example, if the armature overshoots, then more damping can be provided. If the armature approaches the desired lift exponentially, then less damping can be used.

Damping can also be provided electrically by having a finite source impedance of the driver.

—Voltage Drive—

A more complex driving method can be used which gives a higher resonant frequency, as the back emfs cause currents to flow, opposing any motion, allowing faster switching.

Fastest switching within a limited drive voltage/current envelope can be achieved if, by the end of the switching phase, three conditions are met namely, (i) the armature velocity is zero, (ii) the lift is at the target value and (iii) the current is appropriate to maintain this lift. The drive waveform can be trimmed to achieve these conditions.

As explained earlier, for a single pulse from a non-controlled voltage rail, three parameters can controlled namely, $T_{on1}$, $T_{off}$ and $T_{on2}$. $T_{on1}$ primarily affects lift at end of turn on, $T_{off}$ primarily affects the velocity of the armature at the end of turn on and $T_{on2}$ primarily affects current at end of turn on.

In these schemes, the most stable way to control these parameters in a repetitive pulse system is to use feed forward from one pulse to the next.

Referring to FIG. 24a, an end of a pulse current error can be found by inspecting cosine component of current oscillation at the resonant frequency of the armature/spring system starting at the end of the turn-on pulse $112_1$. A velocity error can be found by inspecting the sine component of the oscillation. Not attaining the correct lift also results in a cosine component of oscillation. These can be distinguished by the position error having a current drift superimposed on the oscillation as the actuator exponentially moves toward the quasi static position with a relatively slow (for example typically several times the oscillation period) time constant set by the motor factor and resistance. This can be achieved by using current monitor, turn-on corrections inferred and applied to a subsequent injection cycle.

Accurate long term update of the attained lift versus current in quasi static operation can be done by the combustion monitoring loop, and/or mapped for external conditions, for example fuel rail pressure, temperature (which may be sensed by the coil resistance).

Figure 25A:
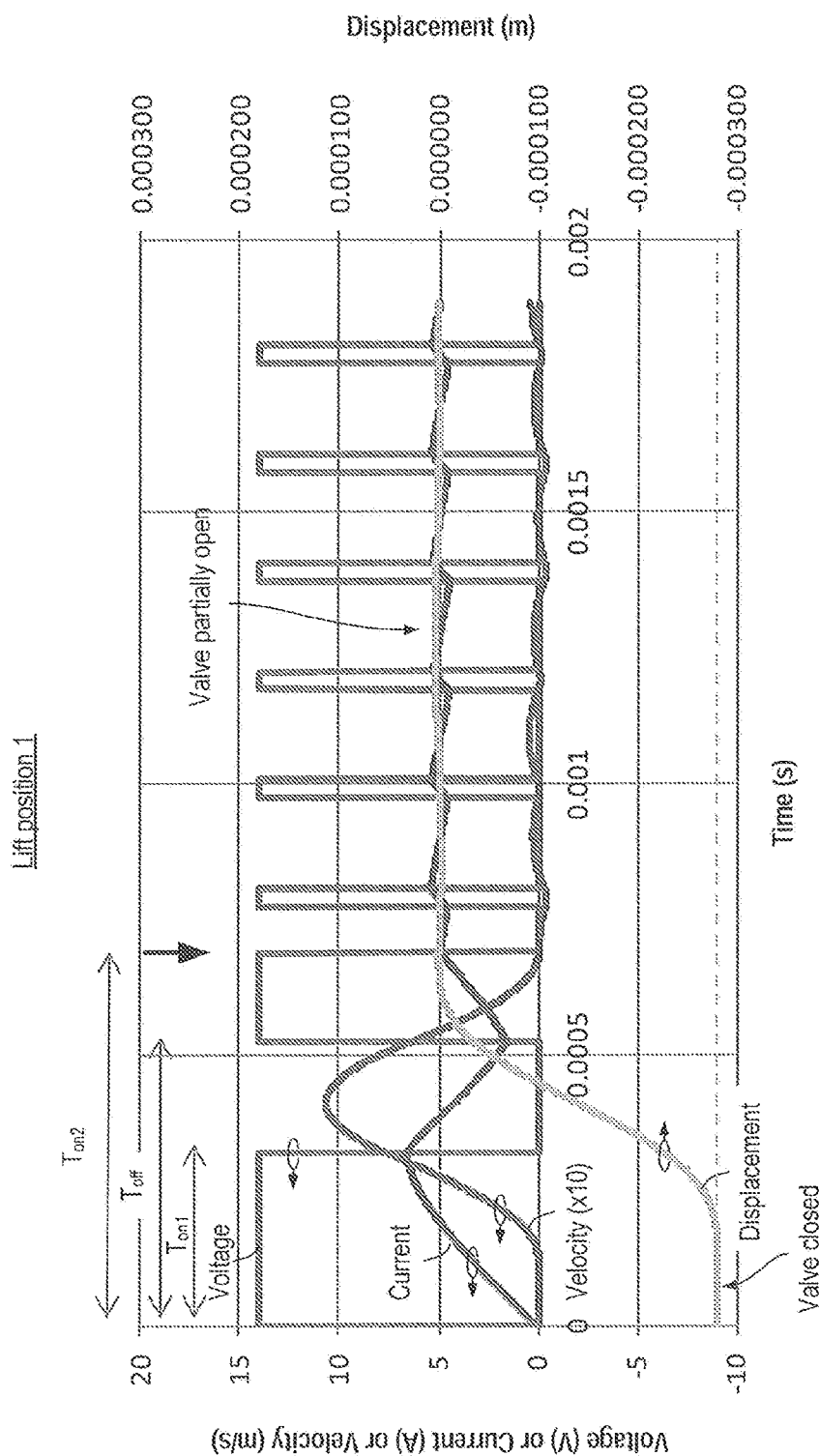
FIGS. 25a to 25c illustrate drive voltage waveforms, currents, armature velocities and displacements for three different lifts.
Figure 25B:
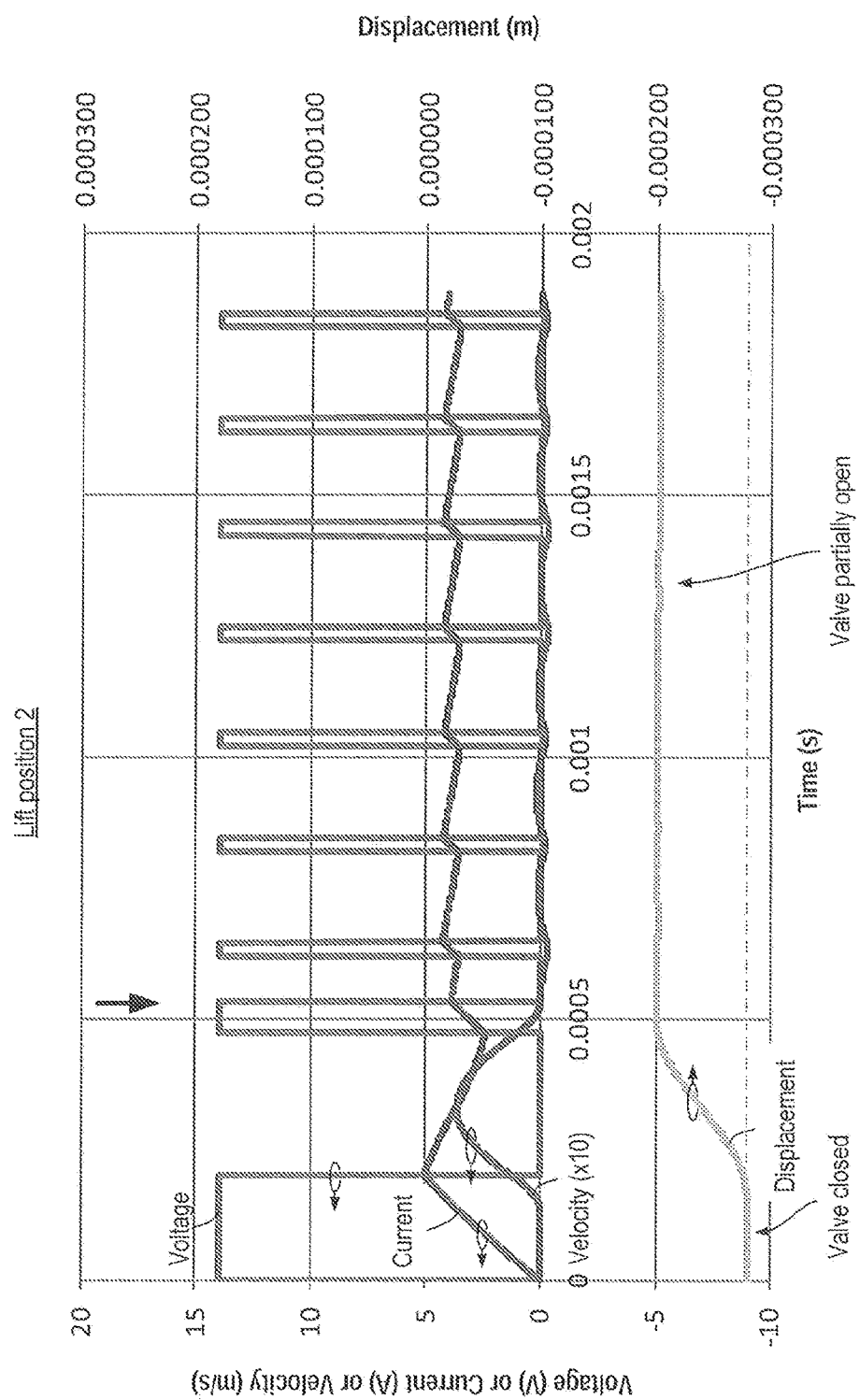
Figure 25C:
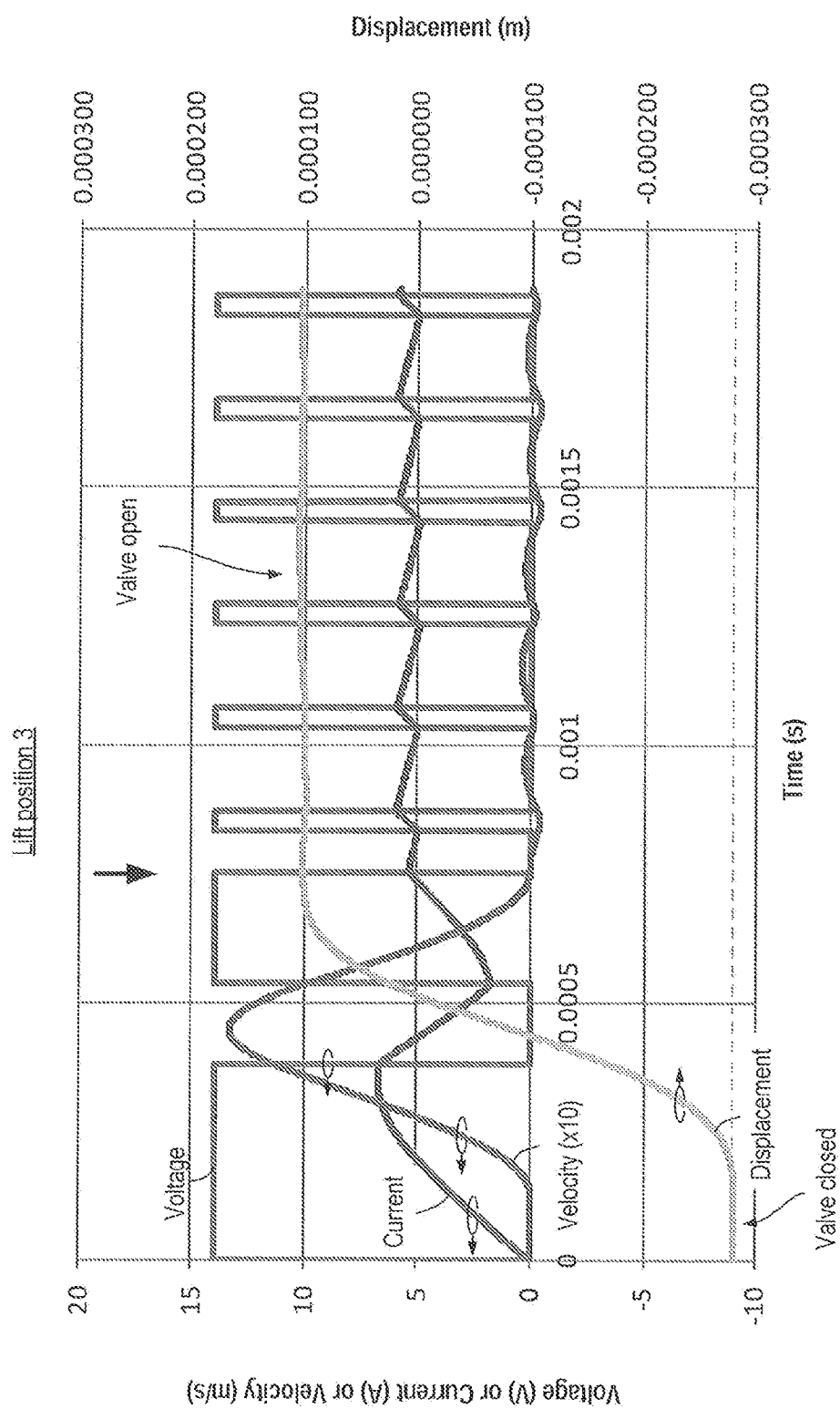

FIGS. 25a to 25c illustrate how changes in $T_{on1}$, $T_{off}$ and $T_{on2}$ can be used to provide different lift positions. FIGS. 25a to 25c are modelled using the following parameters:

TABLE 1

| Parameter | Value | Units |
|---|---|---|
| Bias (armature midway) | 0.6 | T |
| Pole area | 130 | mm$^2$ |

TABLE 1-continued

| Parameter | Value | Units |
|---|---|---|
| Gap size | 610 | μm |
| Mechanical spring constant | 300 | Nmm$^{-1}$ |
| Neutral position of spring | −180 | μm |
| Saturation | 1.7 | T |
| Armature mass | 5 | g |
| Valve closed position | −280 | μm |
| Number of turns in coil | 43 | − |
| Coil resistance | 0.5 | Ω |
| Coil inductance | 0.5 | mH |
| Motor constant | 11 | NA$^{-1}$ |
| Magnetic spring constant | −244 | Nmm$^{-1}$ |
| Sealing force | 38 | N |
| Time step size | 4 | μs |
| $V_{supply}$ | 14 | V |
| $T_{on1}$, $T_{off}$, $T_{on2}$ | As shown | s |

As shown in FIGS. 25a to 25c, increasing $T_{on1}$ increases the lift.

Modifications

It will be appreciated that various modifications may be made to the embodiments hereinbefore described. Such modifications may involve equivalent and other features which are already known in the design, manufacture and use of actuators and/or injectors and component parts thereof and which may be used instead of or in addition to features already described herein. Features of one embodiment may be replaced or supplemented by features of another embodiment.

For example, the extended and/or multiple actuators herein described can be used in the fuel injectors herein described. The anti-bounce arrangement herein described can be used for outward opening injectors. Cylindrical flexure and/or plate-based flexures herein described can be used with injectors herein described. The different magnet materials and/or soft magnetic materials herein described can be used in the fuel injectors herein described. The control units in the fuel injectors herein described can be used with the actuators and/or injectors herein described.

An actuator may be used in a servo valve in a gasoline, diesel, gaseous or other fluid valve.

Orientation of the permanent magnets may be reversed, e.g. inwardly-oriented magnets may be re-orientated to be outwardly-orientated magnets. In this case, polarity of drive current is reversed.

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. A method of operating a fuel injector comprising a solenoid actuator comprising an armature, pole piece(s), electromagnet coil(s) arranged, in response to energisation, to cause travel of the armature between first and second positions along a direction of travel, and spring(s) arranged to bias the armature, wherein in the first position the fuel injector is closed and wherein quasi-static position of the armature is at least monotonic with the coil current over all or some of length of travel of the armature, the method comprising:
applying, in a cycle, drive waveform(s) to the electromagnet coil(s), the drive waveform(s) including turn-on drive waveform(s) having profile(s) and duration so as to position the armature at a position between the first and second positions and at which the armature is at rest, and turn-off drive waveform(s) having profile(s) and duration so as to cause the armature to move towards the first position;
obtaining measurement(s) of at least one of back emf, current, and resistance from the electromagnet coil(s); and
adjusting the drive waveform(s) applied to the electromagnet coil(s) in at least one of the cycle and a subsequent cycle using the measurement(s).

2. A method according to claim 1 wherein the current towards the end of the turn on drive waveform is adjusted to cause forces on the armature to come in to balance at the end of the turn on drive waveform.

3. A method according to claim 1, comprising:
applying hold drive waveform(s) to the electromagnet coil(s) having profile(s) and duration so as to hold the armature at the position between the first and second positions and to drive current(s) through the electromagnet coil(s).

4. A method according to claim 1, wherein at least one of the turn-off drive waveform(s) includes a bias profile portion of opposite polarity to the turn-on drive waveform(s).

5. A method according to claim 1, comprising:
applying anti-bounce drive waveform(s) to the electromagnet coil(s) so as to decelerate the armature returning to the first position.

6. A method according to claim 1, comprising:
providing predefined drive waveform(s); and
adapting the predefined drive waveform(s) based on a previously-delivered drive waveform(s).

7. A method according to claim 1, comprising:
providing a boost waveform so as to cause the armature to reach a desired hold position and then providing a constant low impedance voltage so as to hold the armature stable in the desired hold position for each injection.

8. A method according to claim 7, comprising:
maintaining voltage using a PWM supply.

9. A method according to claim 1 comprising after driving current in a first direction, driving current in a second, reverse direction through the electromagnet coil(s).

10. A method according to claim 1 comprising:
applying a negative current through the electromagnet coil(s) to hold the armature at the first position.

11. A method according to claim 1 comprising:
applying a negative current through the electromagnet coil(s) to enable fast movement of the armature towards the first position.

12. A method according to claim 1 comprising:
applying a first and second pulses to enable the armature to achieve a stable position at the second position or at a position in between the first and second positions.

13. A method according to claim 1 comprising:
adapting impedance so as to match the electromagnetic coil(s) to reduce bounce when the armature stops travelling.

14. A method according to claim 1 comprising:
generating a voltage in dependence upon a fixed mark space ratio produced by a controller.

15. A method according to claim 1 comprising:
measuring emf(s) from the electromagnet coil(s) when driving current in constant current mode.

16. A method according to claim 15 comprising:
controlling the drive waveform(s) applied to the electromagnetic coil(s) in dependence upon the measured emf(s).

17. A method according to claim 1 comprising:
measuring current through electromagnet coil(s) when in constant voltage mode.

18. A method according to claim 1 comprising:
controlling the drive waveform(s) applied to the electromagnetic coil(s) in dependence upon measured current(s).

19. A method according to claim 1 comprising:
determining armature position in dependence upon measured emf(s).

20. A method according to claim 1 comprising:
determining armature position in dependence upon measured current(s).

21. A method according to claim 1 comprising:
analysing measured emf(s).

22. A method according to claim 1 comprising:
analysing current(s) through the electromagnet coil(s).

23. A control unit configured to perform the method according to claim 1.

24. A system comprising:
a fuel injector comprising a solenoid actuator comprising:
    an armature;
    pole piece(s);
    electromagnetic coil(s) arranged, in response to energisation, to cause travel of the armature between first and second positions along a direction of travel;
    spring arranged to bias the armature; and
    a control unit according to claim 23 operatively connected to the actuator.

25. The system of claim 24, further comprising permanent magnet(s) positioned and orientated for latching the armature in at least the first position.

26. A system according to claim 24, wherein the solenoid actuator further comprises:
a pintle;
wherein the pintle is disengageably coupled to the armature.

27. The method of claim 1, wherein permanent magnet(s) are positioned and orientated for latching the armature in at least the first position.

28. A method according to claim 1, wherein the solenoid actuator further comprises a pintle which is disengageably coupled to the armature.

29. A method according to claim 1, comprising:
using pulse width modulation to form the hold drive waveform(s).

* * * * *